US012041854B2

(12) United States Patent
Hong

(10) Patent No.: US 12,041,854 B2
(45) Date of Patent: Jul. 16, 2024

(54) MAGNETIC TUNNEL JUNCTION DEVICE, MAGNETIC MEMORY USING THE SAME AND METHOD FOR MANUFACTURING THE SAME

(71) Applicant: UIF (University Industry Foundation), Yonsei University, Seoul (KR)

(72) Inventor: Jongill Hong, Seoul (KR)

(73) Assignee: UIF (University Industry Foundation), Yonsei University, Seoul (KR)

( * ) Notice: Subject to any disclaimer, the term of this patent is extended or adjusted under 35 U.S.C. 154(b) by 509 days.

(21) Appl. No.: 17/509,748

(22) Filed: Oct. 25, 2021

(65) Prior Publication Data
US 2022/0131069 A1    Apr. 28, 2022

(30) Foreign Application Priority Data
Oct. 26, 2020   (KR) .................. 10-2020-0139656

(51) Int. Cl.
| H10N 50/80 | (2023.01) |
| G11C 11/16 | (2006.01) |
| H10B 61/00 | (2023.01) |
| H10N 50/01 | (2023.01) |
| H10N 50/85 | (2023.01) |

(52) U.S. Cl.
CPC .......... H10N 50/80 (2023.02); G11C 11/161 (2013.01); H10B 61/00 (2023.02); H10N 50/01 (2023.02); H10N 50/85 (2023.02)

(58) Field of Classification Search
CPC ........ H10N 50/80; H10N 50/01; H10N 50/85; H10N 50/10; G11C 11/161; H10B 61/00
USPC ....................................................... 365/173
See application file for complete search history.

(56) References Cited

U.S. PATENT DOCUMENTS 7,252,852 B1 *  8/2007  Parkin ................. H01F 10/3254
                                                              428/811.1
10,665,773 B2    5/2020  Iwata et al.

FOREIGN PATENT DOCUMENTS

| CN | 107887503 A | * | 4/2018 | ........... H01L 27/228 |
| CN | 110660907 A | * | 1/2020 | ........... G01R 33/098 |
| EP | 3143649 B1 | * | 10/2018 | ........... G01R 33/096 |
| JP | 2004179250 A | * | 6/2004 | |
| KR | 2017-0107612 A | | 9/2017 | |
| KR | 2020-0095726 A | | 8/2020 | |
| WO | WO-2010044134 A1 | * | 4/2010 | ............. B82Y 10/00 |
| WO | WO-2019193871 A1 | * | 10/2019 | ........ G01R 33/0052 |

* cited by examiner

*Primary Examiner* — Fernando Hidalgo

(57) ABSTRACT

Disclosed art a magnetic tunnel junction device, a magnetic memory using the same, and a method for manufacturing the same. The method for manufacturing the magnetic tunnel junction device may include the steps of a lamination step of forming an initial multilayer structure including at least one metallic oxide layer and a metallic layer on a substrate; a heat treatment step of heat-treating the initial multilayer structure; and a device forming step of forming a magnetic tunnel junction device of a final multilayer structure in which at least one metallic oxide layer and the metallic layer are converted to at least one ferromagnetic material layer and the oxide layer by heat treatment.

20 Claims, 21 Drawing Sheets

[FIG. 1A]
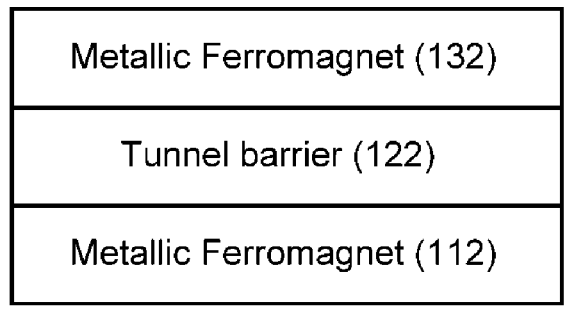
[FIG. 1B]
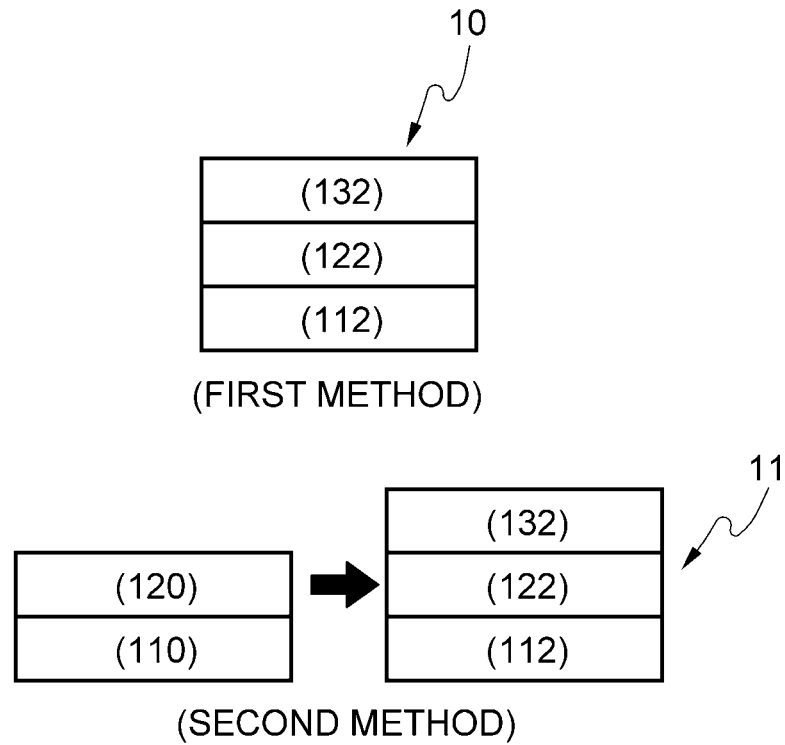
(FIRST METHOD)
(SECOND METHOD)

[FIG. 2]
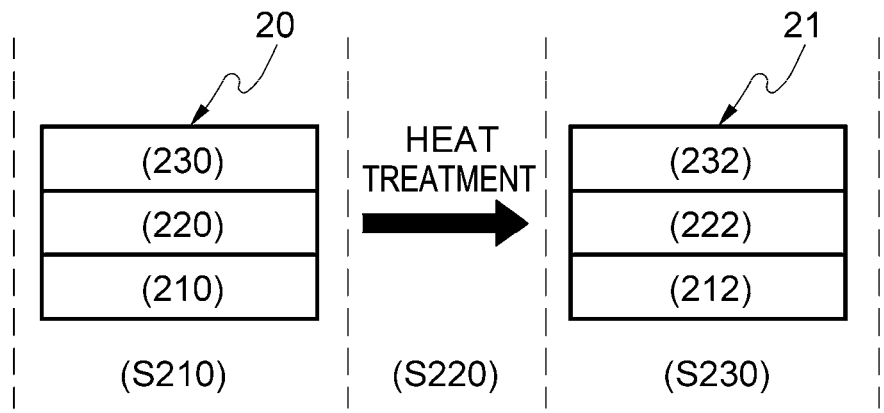
[FIG. 3]
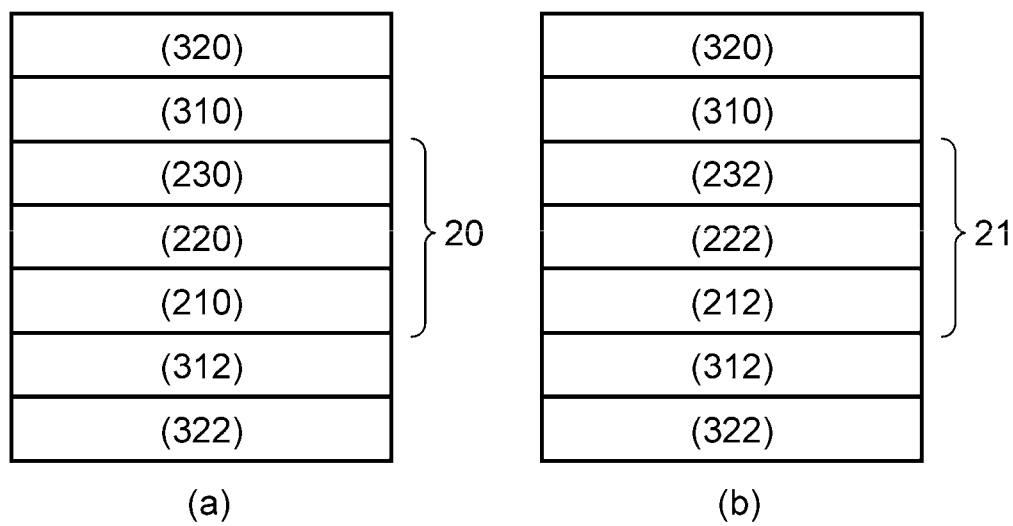

[FIG. 4]
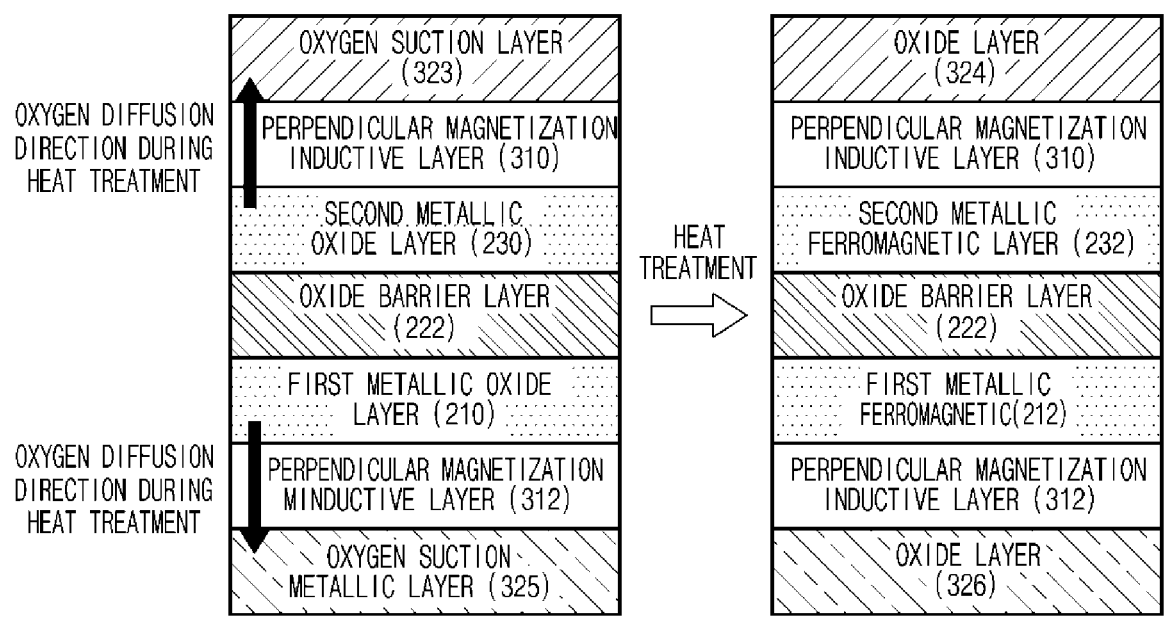

[FIG. 5]
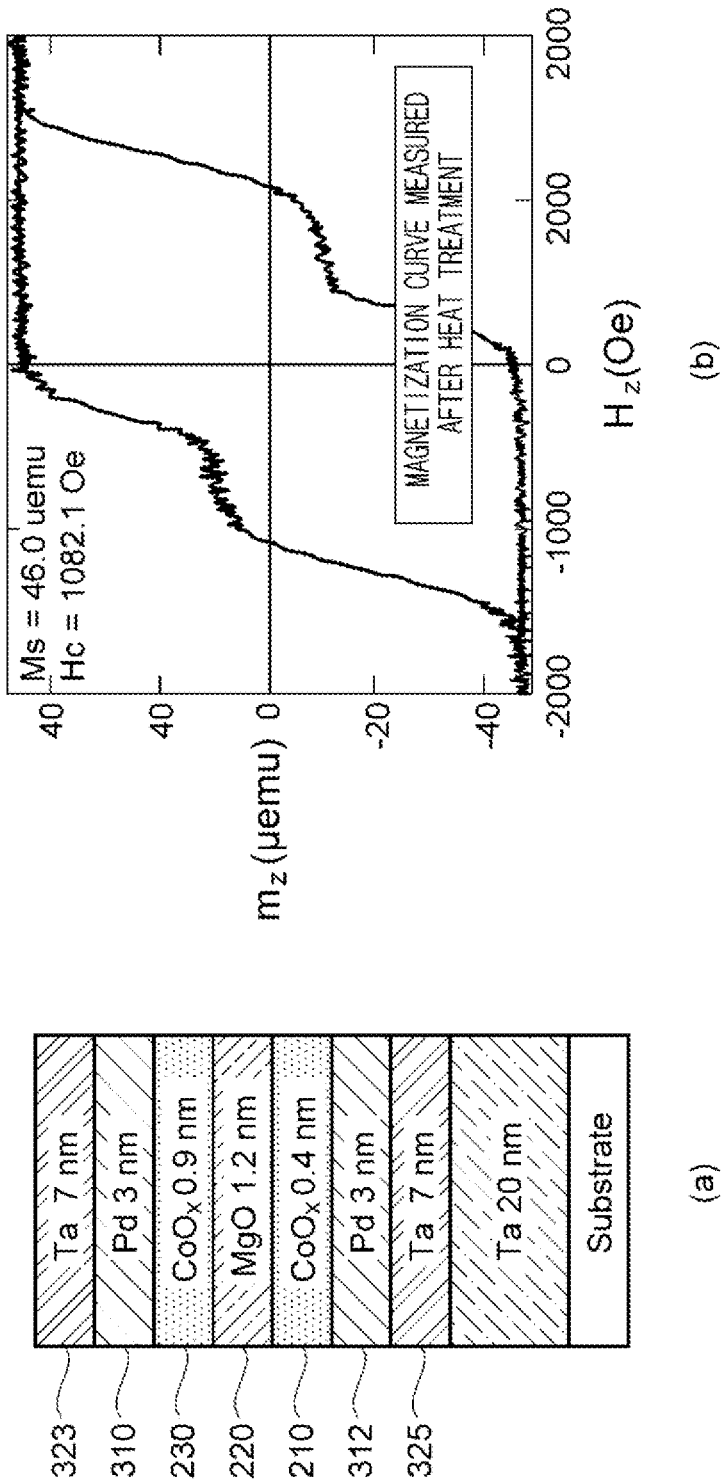

[FIG. 6]
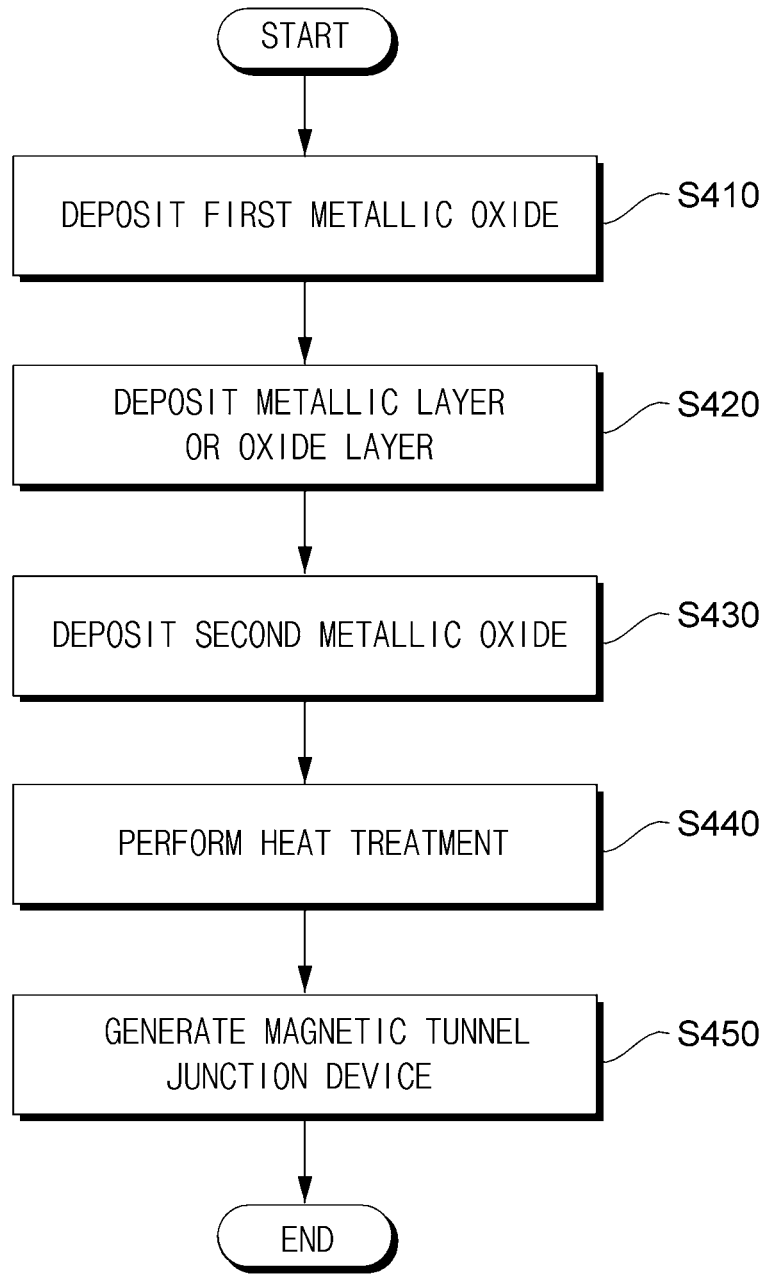

[FIG. 7]
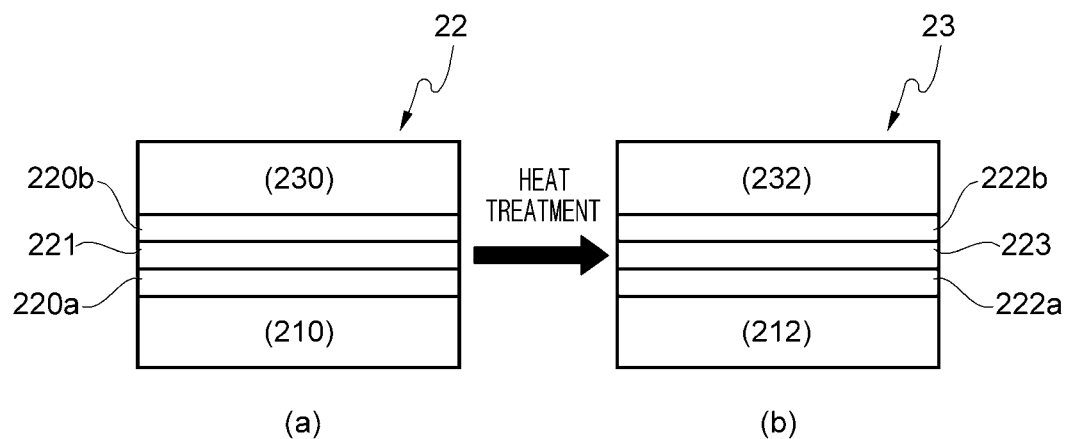

[FIG. 8]
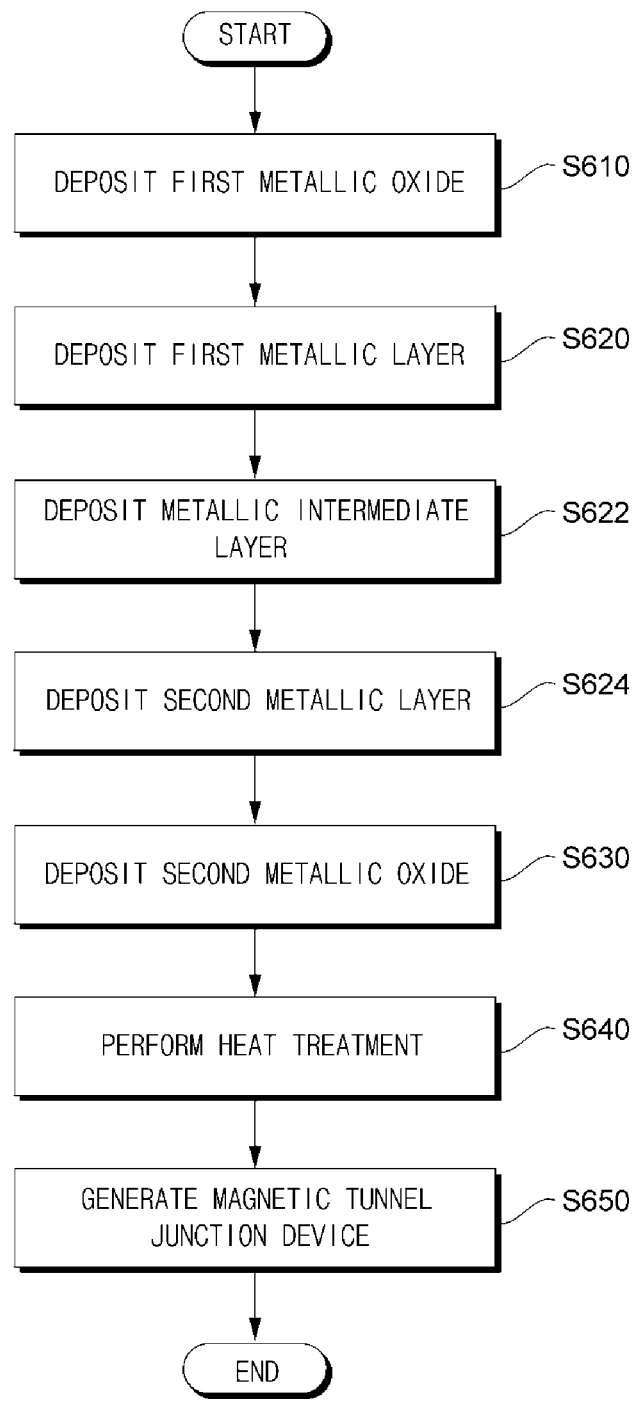

[FIG. 9]
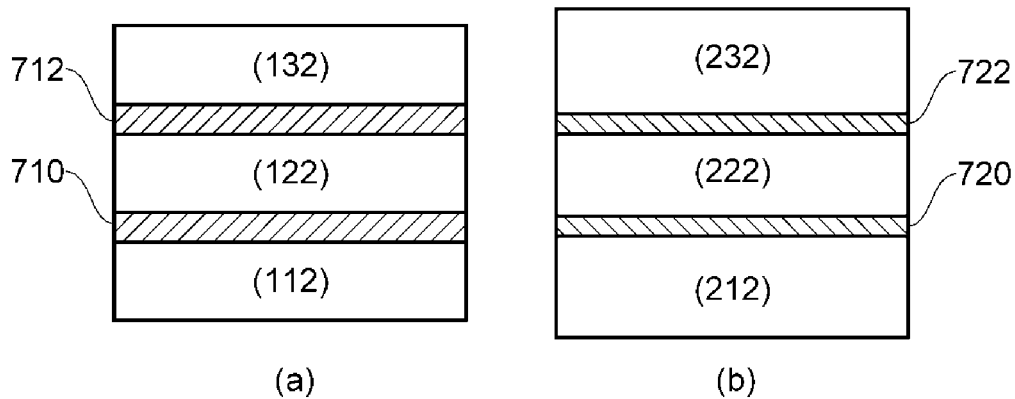
[FIG. 10]
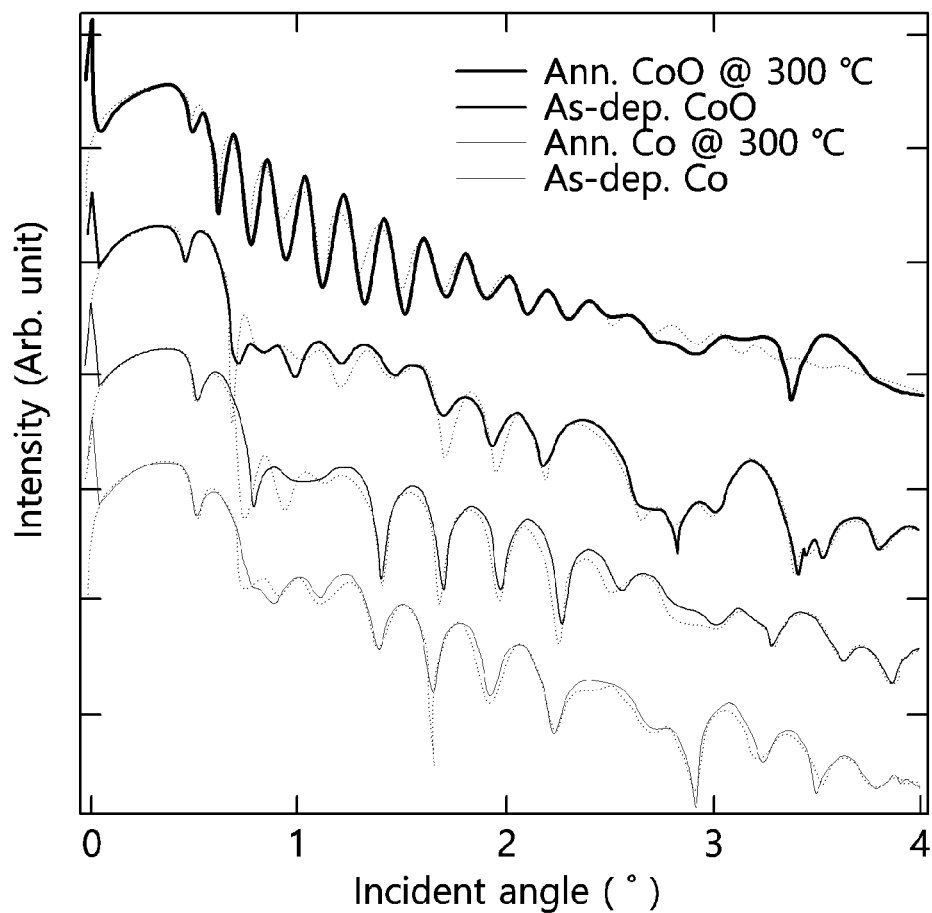

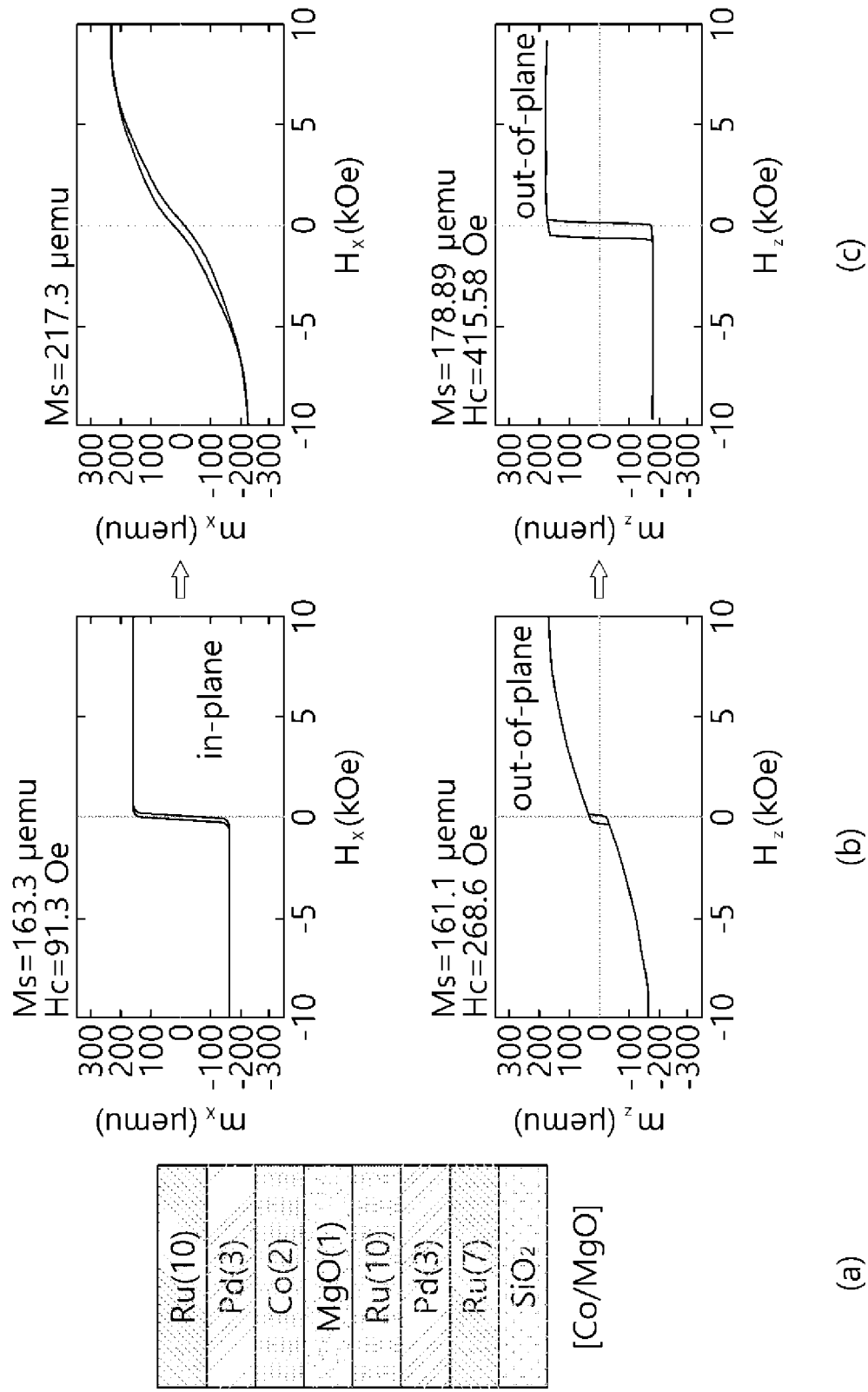
[FIG. 11]

[FIG. 12]
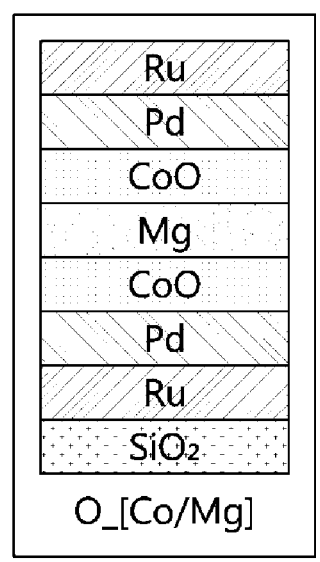

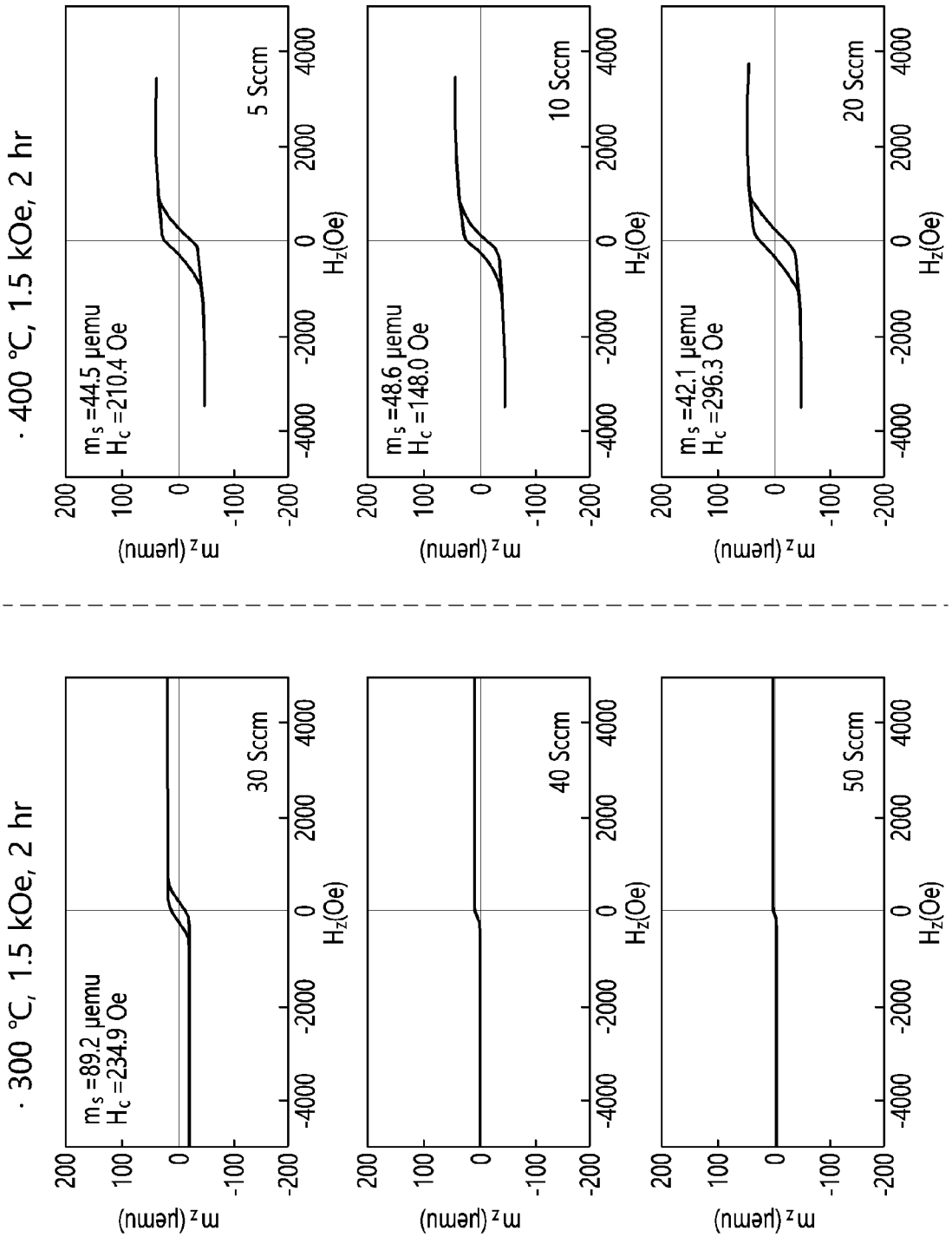
[FIG. 13A]

[FIG. 13B]
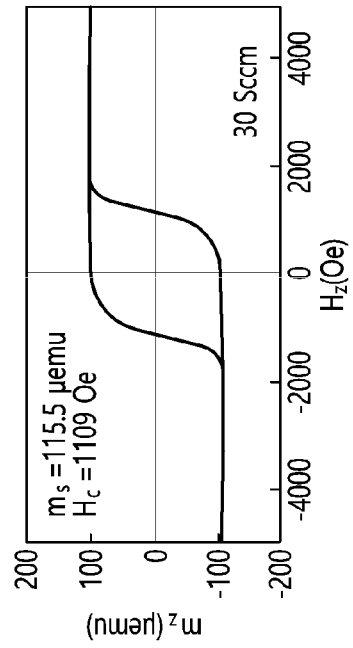
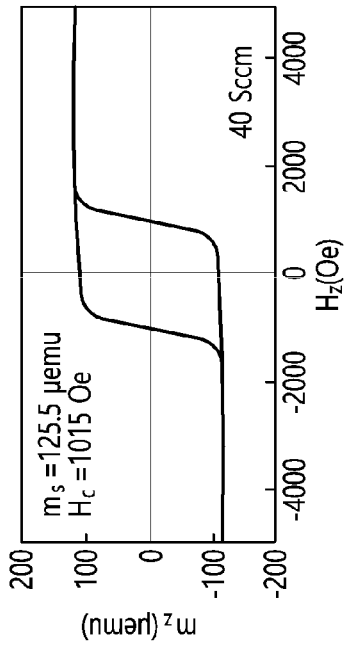
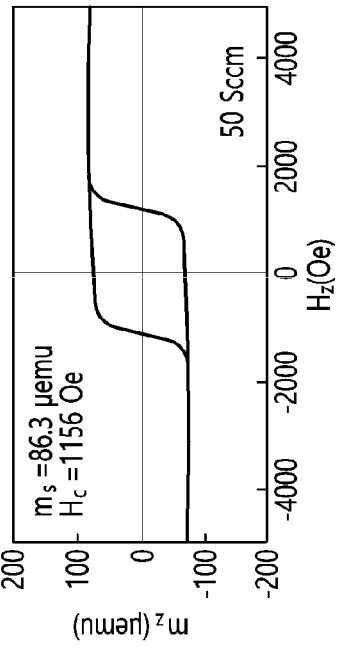
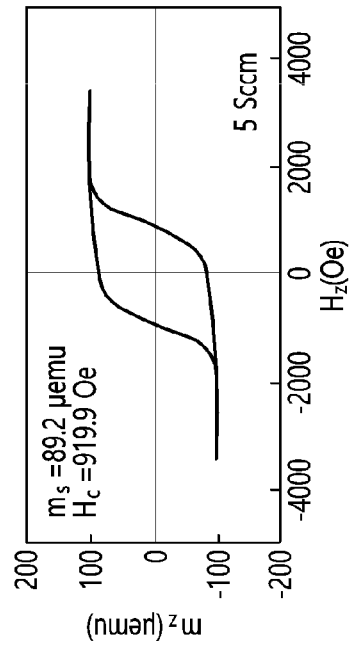
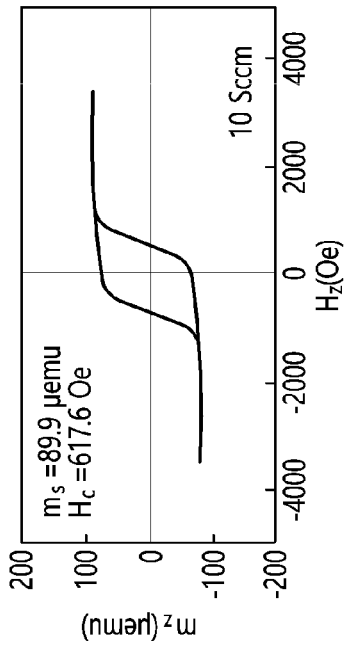
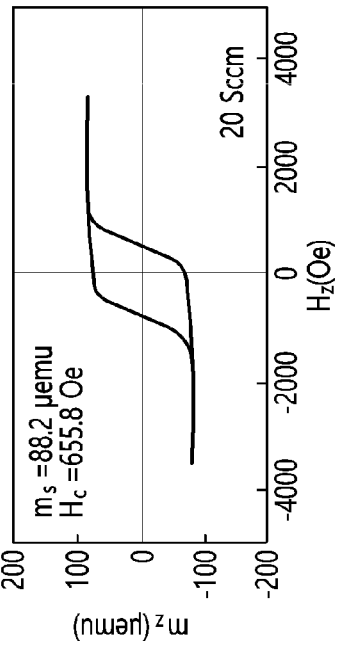

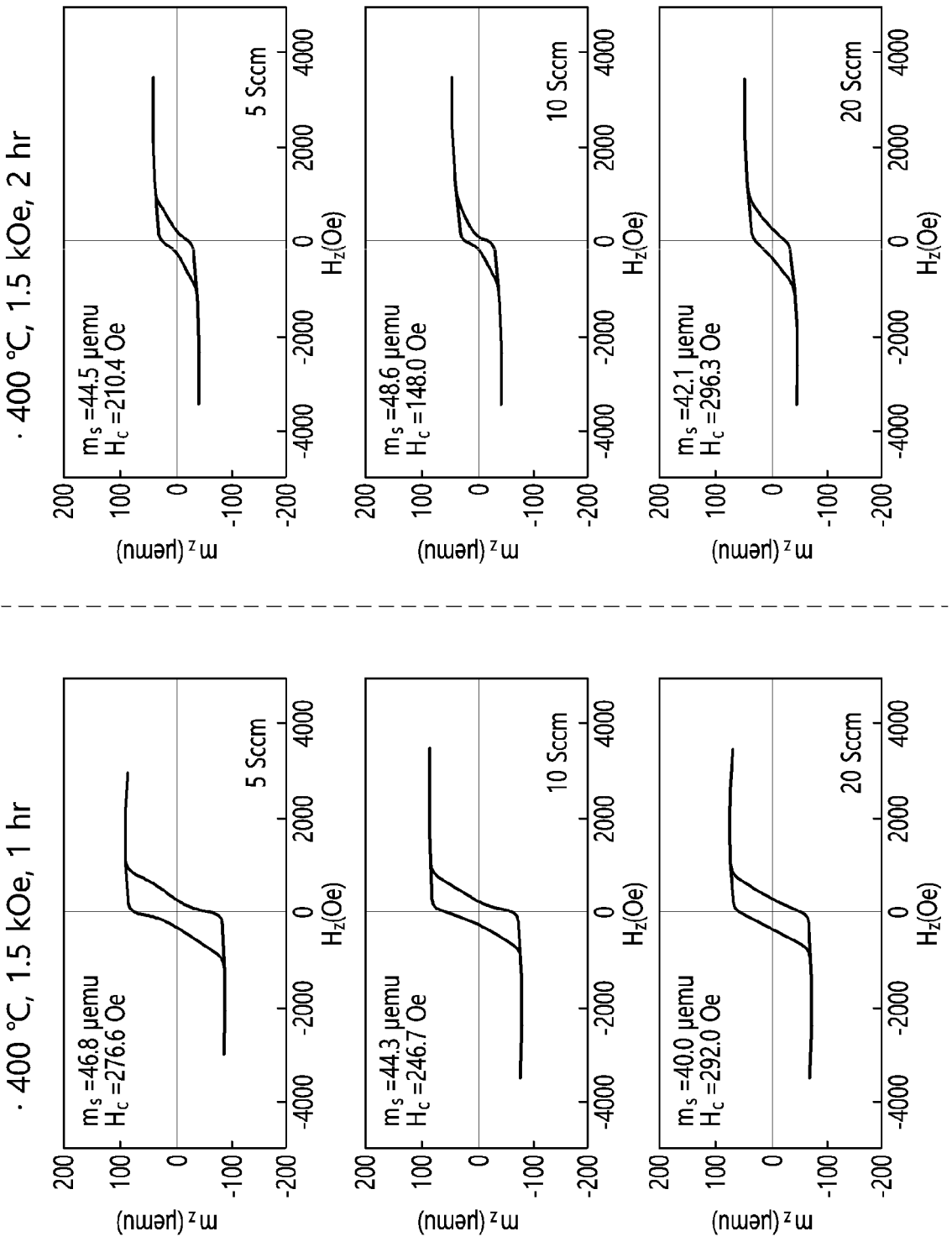
[FIG. 14A]

[FIG. 14B]
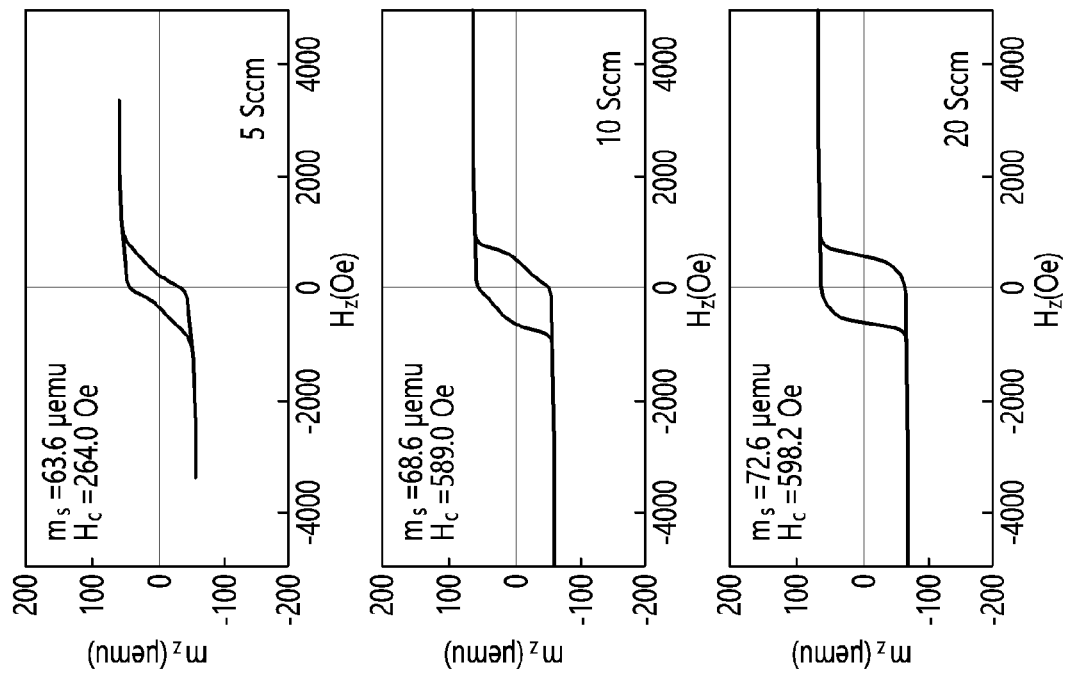
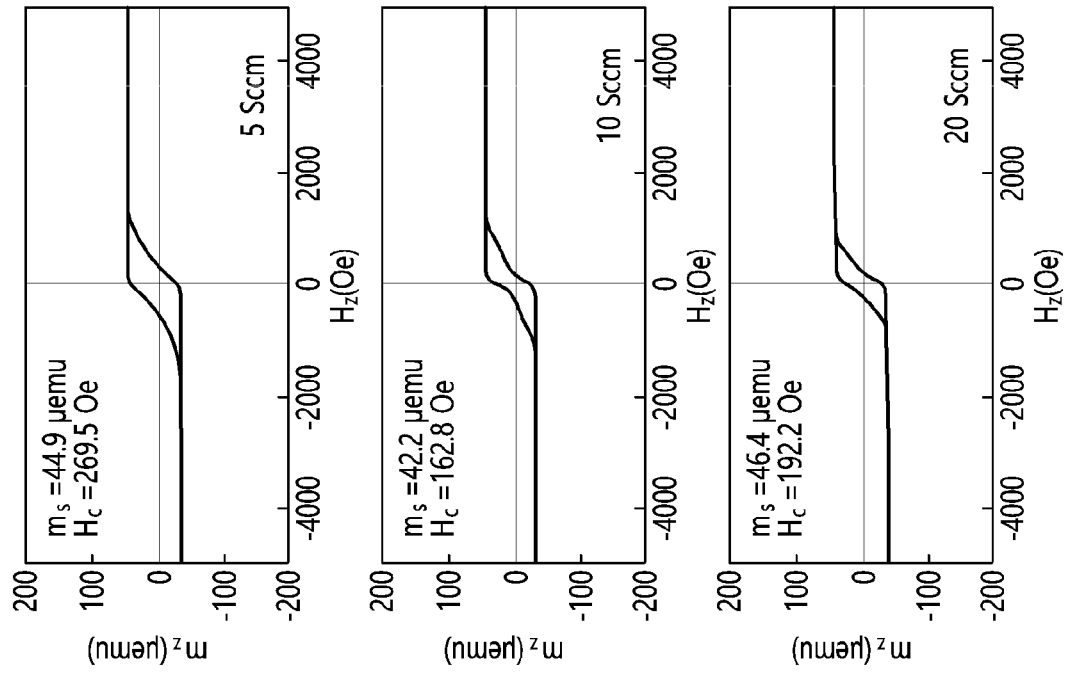

[FIG. 14C]
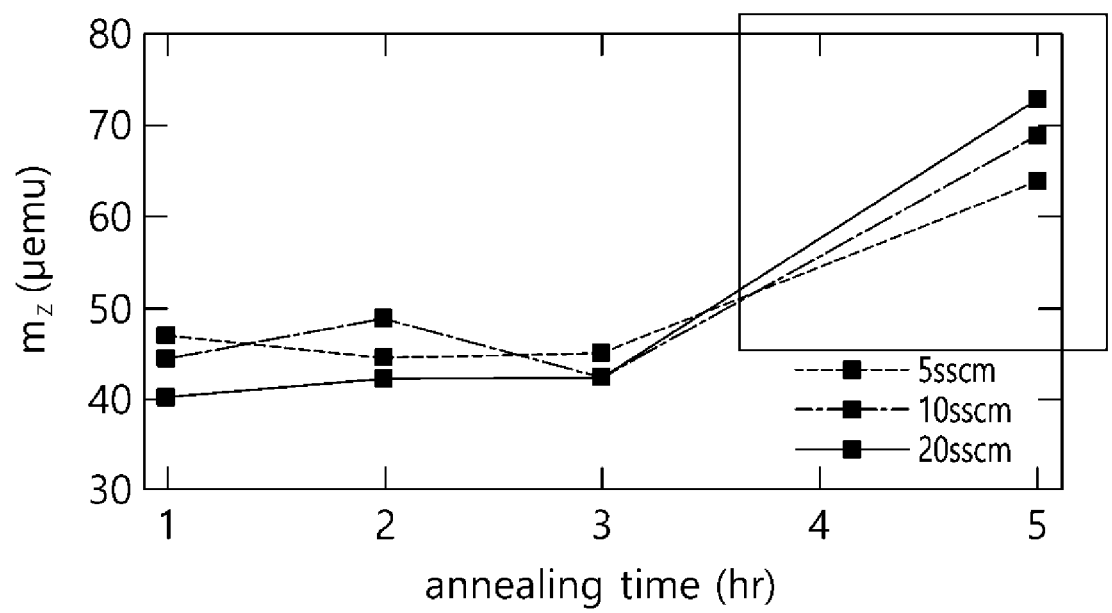

[FIG. 15A]
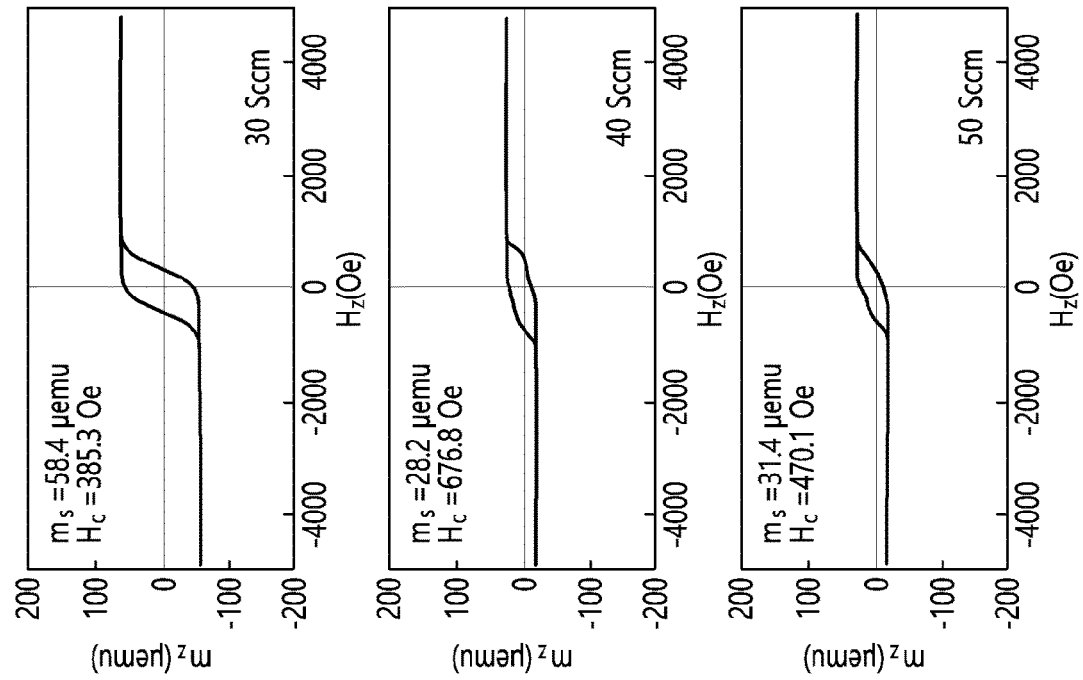
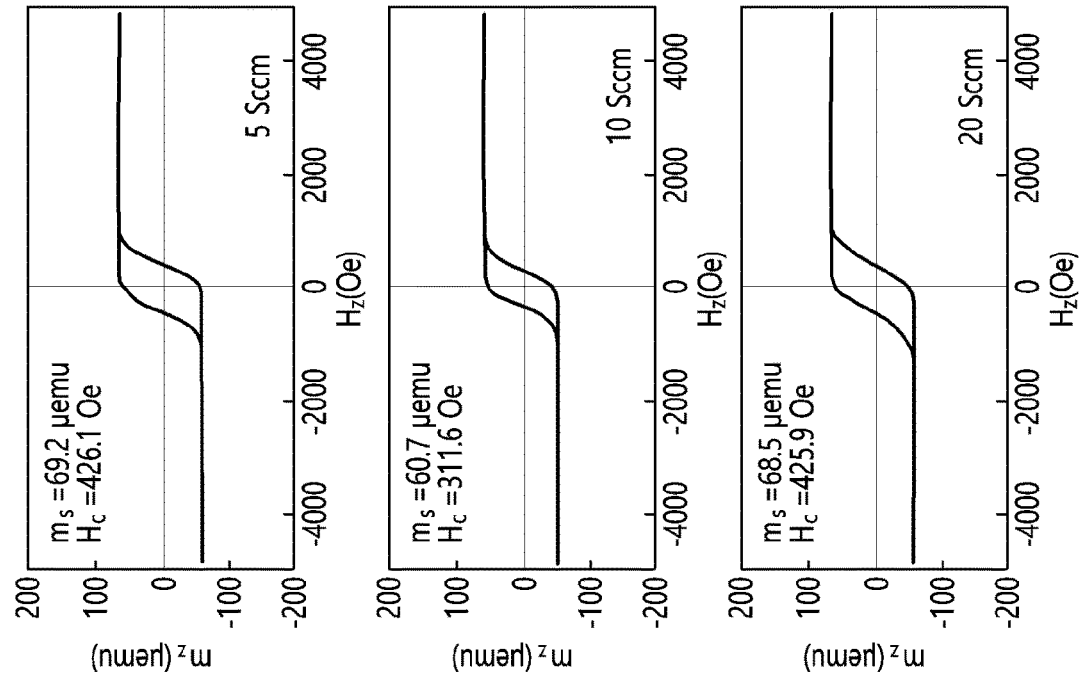

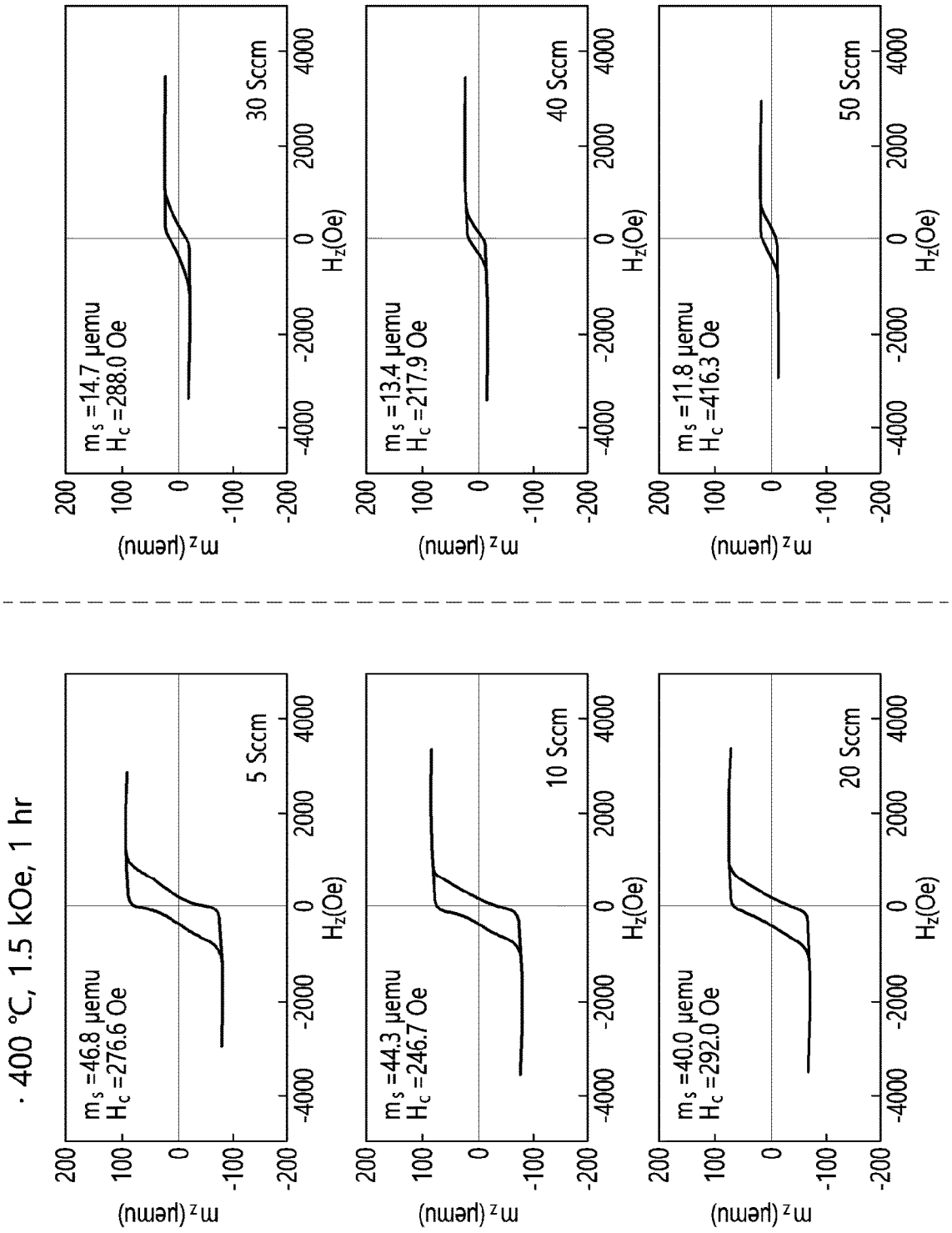

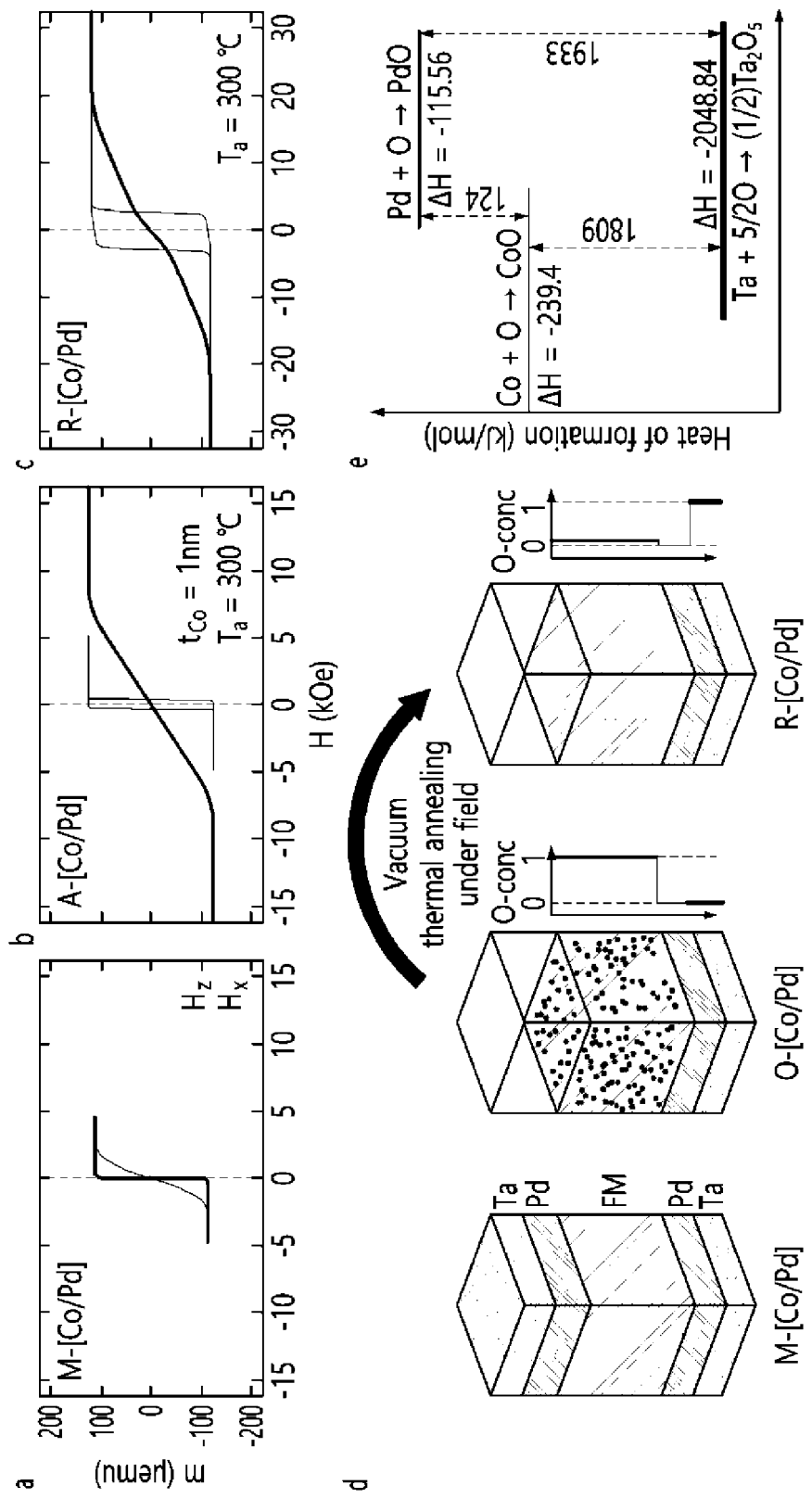
[FIG. 16]

[FIG. 17]
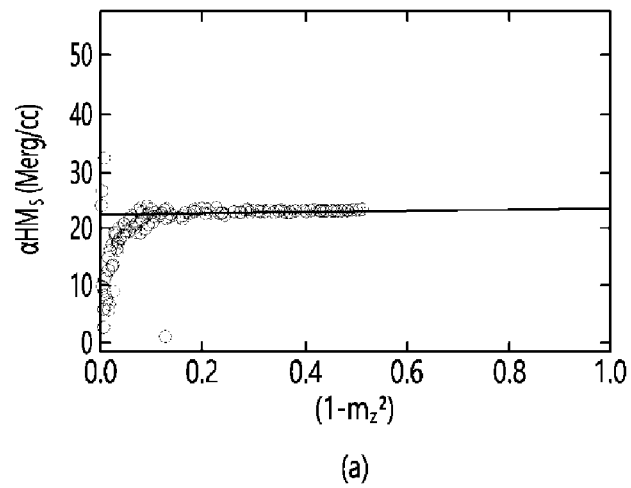
(a)
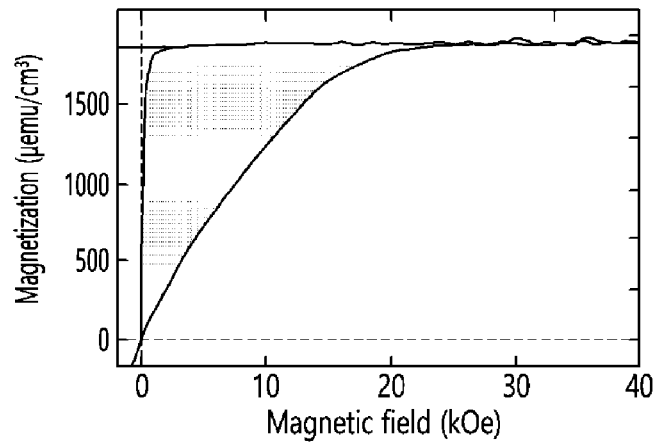
(b)
| | GST | | M-H area | |
|---|---|---|---|---|
| $t_{Co}$ | $K_{u,eff}$ (erg/cm³) | $K_u$ (erg/cm³) | $K_{u,eff}$ (erg/cm³) | $K_u$ (erg/cm³) |
| 1 nm | $1.15 \times 10^7$ | $3.25 \times 10^7$ | $1.27 \times 10^7$ | $3.37 \times 10^7$ |
| 2 nm | $2.73 \times 10^5$ | $1.95 \times 10^7$ | $3.90 \times 10^6$ | $2.07 \times 10^7$ |
(c)

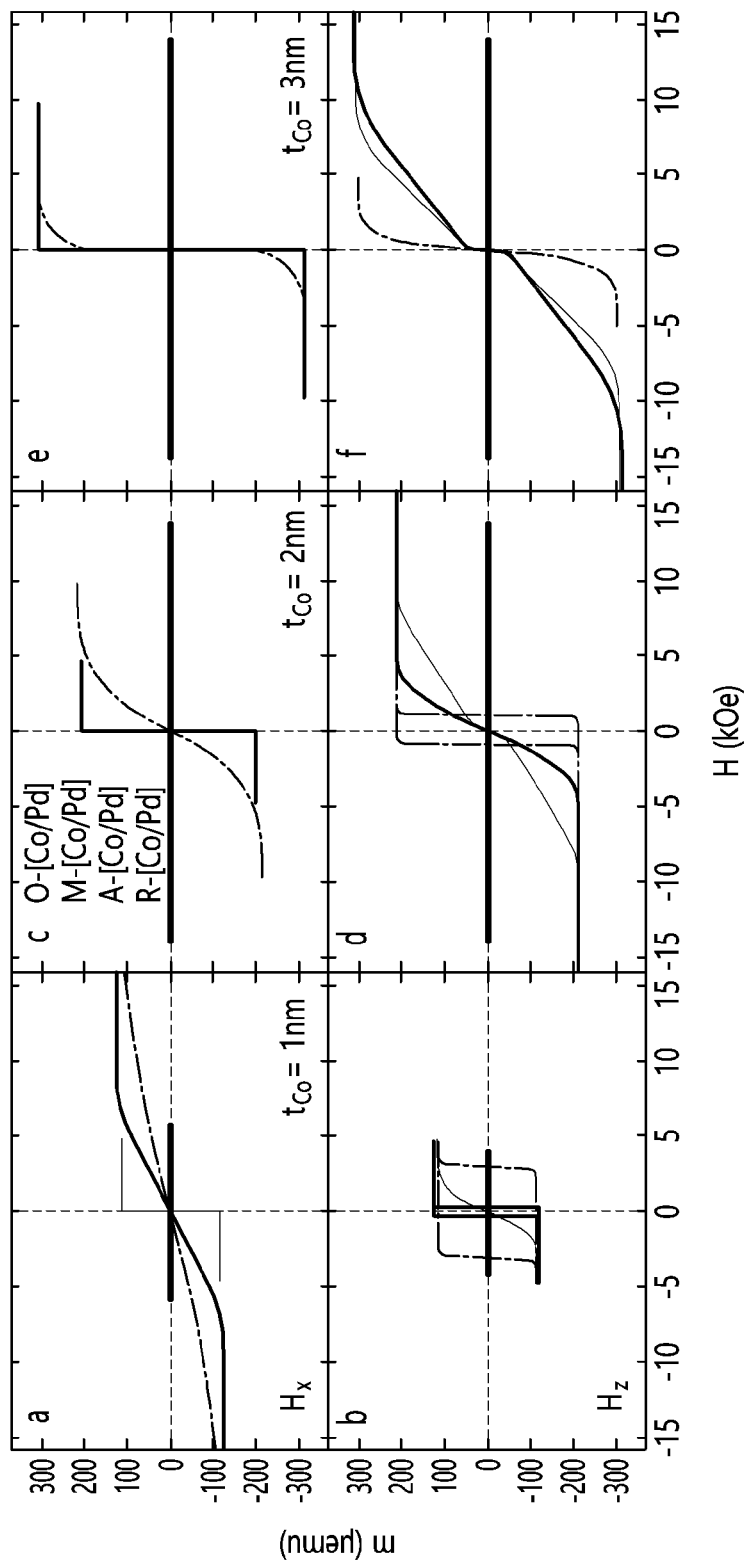
[FIG. 18]

[FIG. 19]
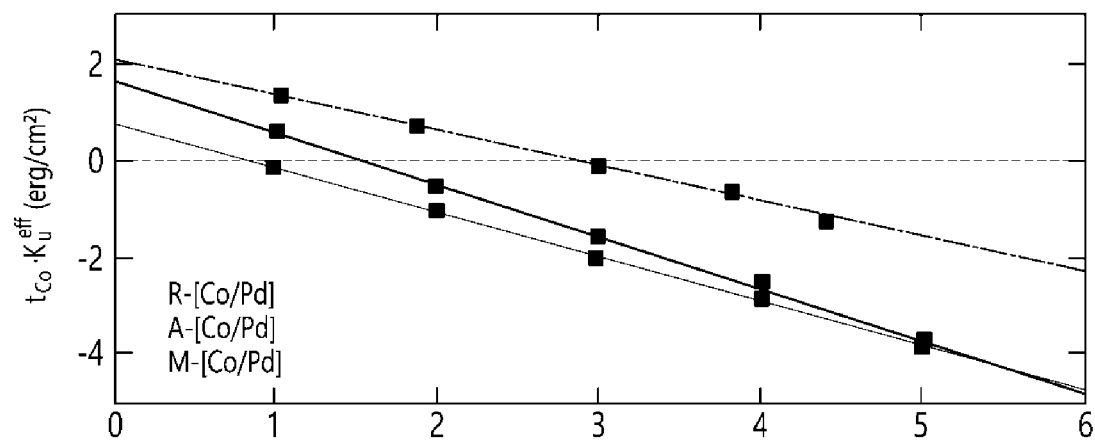

MAGNETIC TUNNEL JUNCTION DEVICE, MAGNETIC MEMORY USING THE SAME AND METHOD FOR MANUFACTURING THE SAME

CROSS-REFERENCE TO RELATED APPLICATIONS

This application claims priority to and the benefit of Korean Patent Application No. 10-2020-0139656 filed in the Korean Intellectual Property Office on Oct. 26, 2020, the entire contents of which are incorporated herein by reference.

TECHNICAL FIELD

The present invention relates to a magnetic tunnel junction device, a magnetic memory using the same, and a method for manufacturing the same.

BACKGROUND ART

Contents described in this section merely provide background information on exemplary embodiments of the present invention and do not constitute the related art.

A magnetic memory device (e.g., magnetic random access memory (MRAM)) is an important future device which is attracting attention to the most promising memory among next-generation nonvolatile memories and is expected to play an important role in logic as well as memory. A magnetic tunnel junction device, which is a configuration element of the magnetic memory device, is a key device that determines memory characteristics. Therefore, it is an important topic how the junction structure can be prepared and how desired crystal phases in the structure can be obtained.

The magnetic tunnel junction device consists of a metal ferromagnetic layer 112 (e.g., CoFeB), a tunnel barrier oxide layer 122 (e.g., MgO), and a metal ferromagnetic layer 132 (e.g., CoFeB). Those layers are an ultra thin film with a thickness of each layer of about 1 nm (FIG. 1A). A technique of making an oxide layer (e.g., MgO) as the tunnel barrier to have a <001> structure without oxidizing the ferromagnetic layer is the most important and this is to increase an output by coherent tunneling. That is, the spin polarization of a ferromagnetic metal is maintained and tunneled to interact with the spin polarization of the other metal.

However, it is not easy to make a magnetic tunnel junction so as to have such a characteristic, and conventional methods (first method, second method, etc.) of making the magnetic tunnel junction are shown in FIG. 1B.

Referring to FIG. 1B, in the first method, first, the metal ferromagnetic layer 112 is deposited as a lower electrode. The oxide layer 122 and the metal ferromagnetic material layer 132 are sequentially deposited on the lower electrode metal ferromagnetic layer 112 thereof to make a magnetic tunnel junction device 10 having the structure of the metal ferromagnetic material layer 112/tunnel barrier oxide layer 122/metal ferromagnetic material layer 132. Each layer may be prepared by a sputtering (e.g., DC and RF sputtering) method.

In the second method, a metallic layer 120 is deposited on the lower electrode metal ferromagnetic material layer 110 and then oxidation treatment such as natural oxidation or plasma oxidation is formed to form the tunnel barrier oxide layer 122. Thereafter, the metal ferromagnetic material layer 132 is deposited on the tunnel barrier oxide layer 122 to make a magnetic tunnel junction device 11 having the structure of the metal ferromagnetic material layer 112/tunnel barrier oxide layer 122/metal ferromagnetic material layer 132. Each metallic layer may be prepared by a sputtering (e.g., DC and RF sputtering) method.

Due to the method of making such a layered structure, there is a problem that it is difficult to control an interface structure between the metal ferromagnetic material layer and the oxide layer because the metal and the oxide should be separated at atomic levels. When the oxide is deposited, a metallic layer is easily oxidized to lose the ferromagnetic property and the spin polarization disappears. On the contrary, an oxide layer is reduced by losing oxygen to a metal ferromagnetic material layer and does not operate as a tunnel layer. At this time, the reduced portion provides a cause that the tunneling becomes incoherent due to oxide defects. When the amount of oxygen is large in the oxide layer, the metal ferromagnetic material layer is oxidized, and when the amount of oxygen is small, the oxide layer does not act as the tunnel layer, and the coherent tunneling is broken due to defects. Therefore, it is very important to adjust the oxygen amount in the oxide layer.

In order to minimize such side effects, a sputtering chamber for depositing the metal ferromagnetic material layer and the oxide layer is separately provided, or ultra-high vacuum sputtering equipment has been used.

The metal ferromagnetic material layer needs to have perpendicular magnetic anisotropy to have strong thermal stability required for a memory device. Since the metal ferromagnetic material layer has in-plane magnetic anisotropy at a thickness of about 1.0 nm, it is important to maintain the thickness of the metal ferromagnetic material layer to the thickness or less to keep the perpendicular magnetic anisotropy. However, when scaling is progressing, such as other memories, the ferromagnetic material layer where the information is stored is thermally activated and a possibility of losing its information is increased. This is because the switching of a ferromagnetic material is performed by natively receiving the thermal help, and when the temperature rises, the written information is undesirably switched and a probability of malfunction is increased, and thus, the advantage as the memory device is lost.

SUMMARY OF THE INVENTION

The present invention has been made in an effort to provide a magnetic tunnel junction device including at least one ferromagnetic material layer and an oxide layer, and an object of the present invention is to provide a magnetic tunnel junction device with improved performance by depositing metallic oxide and oxide and by heat-treating the layered (or laminated) initial device, a magnetic memory device using the same, and a method for manufacturing the same. Here, the metallic oxide is defined as oxide that is phase-transformed to metal when it is reduced. As an example, Co oxide (CoO) is a metallic oxide and it is reduced to metallic Co.

An exemplary embodiment of the present invention provides a method for manufacturing the magnetic tunnel junction device which may include the steps of a lamination step of forming an initial multilayer structure including at least one metallic oxide layer and a metallic layer on a substrate; a heat treatment step of heat-treating the initial multilayer structure; and a device forming step of forming a magnetic tunnel junction device of a final multilayer structure in which at least one metallic oxide layer and the metallic layer are converted to at least one ferromagnetic material layer and the oxide layer by heat treatment, respectively.

Another exemplary embodiment provides a magnetic tunnel junction device which may include a first ferromagnetic material layer formed by heat-treating a first metallic oxide layer; a second ferromagnetic material layer formed by heat-treating a second metallic oxide layer; and an oxide layer located between the first ferromagnetic material layer and the second ferromagnetic material layer and formed by heat-treating a metallic layer.

Still another exemplary embodiment provides a magnetic memory device which may include at least one bit line; at least one word line; and a first ferromagnetic material layer formed by connecting the at least one bit line and the at least one word line and heat-treating a first metallic oxide layer; a second ferromagnetic material layer formed by heat-treating a second metallic oxide layer; and an oxide layer located between the first ferromagnetic material layer and the second ferromagnetic material layer and formed by heat-treating a metallic layer.

As described above, the present invention has an effect of simply changing a manufacturing process of the magnetic tunnel junction device.

According to exemplary embodiments of the present invention, it is possible to improve data retention of the magnetic tunnel junction device.

It is possible to greatly ensure a process margin by increasing the thickness of the ferromagnetic material layer having perpendicular magnetic anisotropy in the magnetic tunnel junction device.

It is possible to increase the perpendicular magnetic anisotropy of the ferromagnetic material layer in the magnetic tunnel junction device.

It is possible to improve the quality of an interface between the layers of the magnetic tunnel junction device and minimizing atomic intermixing at the interface.

It is possible to improve the quality of the interface between the layers of the magnetic tunnel junction device to induce the coherent tunneling and increase the output of the device.

The foregoing summary is illustrative only and is not intended to be in any way limiting. In addition to the illustrative aspects, exemplary embodiments, and features described above, further aspects, exemplary embodiments, and features will become apparent by reference to the drawings and the following detailed description.

BRIEF DESCRIPTION OF THE DRAWINGS

FIGS. 1A and 1B are diagrams for describing a magnetic tunnel junction device and a method of manufacturing the same in the related art.

FIG. 2 is a diagram for describing a magnetic tunnel junction device and a method of manufacturing the same according to an exemplary embodiment of the present invention.

FIG. 3 is a diagram illustrating a structure of a magnetic tunnel junction device to which a perpendicular magnetization inductive layer according to an exemplary embodiment of the present invention is applied.

FIGS. 4 and 5 are diagrams illustrating an oxygen diffusion direction and a device example of a magnetic tunnel junction device having a perpendicular magnetization inductive layer and an oxygen suction metallic layer.

FIG. 6 is a flowchart for describing a method for manufacturing a magnetic tunnel junction device according to an exemplary embodiment of the present invention.

FIG. 7 is a diagram for describing a magnetic tunnel junction device and a method of manufacturing the same according to another exemplary embodiment of the present invention.

FIG. 8 is a flowchart for describing a method for manufacturing a magnetic tunnel junction device according to another exemplary embodiment of the present invention.

FIG. 9 is a diagram for describing an interface structure of the magnetic tunnel junction device according to the exemplary embodiment of the present invention.

FIG. 10 is a diagram illustrating a result of measuring the roughness of interfaces and the interlayer structure of the magnetic tunnel junction device according to the exemplary embodiment of the present invention.

FIGS. 11 and 12 are diagrams illustrating a structure of a magnetic tunnel junction device in the related art and a structure of a magnetic tunnel junction device according to an exemplary embodiment of the present invention.

FIGS. 13A and 13B are diagrams illustrating experimental results based on a heat treatment temperature of the magnetic tunnel junction device according to the exemplary embodiment of the present invention.

FIGS. 14A to 14C are diagrams illustrating experimental results based on a heat treatment duration of the magnetic tunnel junction device according to the exemplary embodiment of the present invention.

FIGS. 15A and 15B are diagrams illustrating experimental results based on an oxygen flow rate of the magnetic tunnel junction device according to the exemplary embodiment of the present invention.

FIG. 16 is a diagram for describing oxidation and reduction operations for improving the performance of the magnetic tunnel junction device according to the exemplary embodiment of the present invention.

FIG. 17 is a diagram illustrating a result of measuring uniaxial magnetic anisotropic energy of the magnetic tunnel junction device according to the exemplary embodiment of the present invention.

FIG. 18 is a diagram illustrating an experimental result of changes in magnetic properties according to heat treatment according to an exemplary embodiment of the present invention.

FIG. 19 is a diagram illustrating an experimental result of the dependence of magnetic properties in the reduction process according to an exemplary embodiment of the present invention.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particularly intended application and use environment.

In the figures, reference numbers refer to the same or equivalent parts of the present invention throughout the several figures of the drawing.

DETAILED DESCRIPTION

Hereinafter, exemplary embodiments of the present invention will be described in detail with reference to the accompanying drawings. In the following description, a detailed explanation of related known configurations or functions may be omitted to avoid obscuring the subject matter of the present invention. Further, hereinafter, the preferred exemplary embodiment of the present invention will be described, but the technical spirit of the present invention is not limited thereto or restricted thereby, and the exemplary embodiments can be modified and variously executed by those skilled in the art. Hereinafter, a magnetic tunnel junction device, a magnetic memory device using the same, and a method for manufacturing the same proposed in the present invention will be described in detail with reference to the accompanying drawings.

The magnetic tunnel junction device of the present invention may be applied to a magnetic memory device, and the magnetic memory device may include at least one bit line and at least one word line. Here, the magnetic tunnel junction device of the magnetic memory device may connect at least one bit line and at least one word line to each other.

FIG. 2 is a diagram for describing a magnetic tunnel junction device and a method of manufacturing the same according to an exemplary embodiment of the present invention.

The method of manufacturing a magnetic tunnel junction (MTJ) device according to the exemplary embodiment includes a lamination step (S210), a heat treatment step (S220), and a device forming step (S230).

The lamination step 5210 forms an initial multilayer structure 20 including at least one metallic oxide layer and a metallic layer on a substrate. Here, the metallic oxide is defined as oxide that is phase-transformed to metal when it is reduced.

The initial multilayer structure 20 includes a first metallic oxide layer 210, a second metallic oxide layer 230, and a metallic layer 220. In the lamination step 5210, the first metallic oxide layer 210, the metallic layer 220, and the second metallic oxide layer 230 are laminated in sequence to form the initial multilayer structure 20.

The first metallic oxide layer 210 and the second metallic oxide layer 230 are formed of at least one material of NiOx, FeOx, FeNiOx, CoNiOx, CoOx (e.g., CoO, $Co_2O_3$, $Co_3O_4$), CoFeBOx, CoFeOx, etc. or a combined material thereof, and the metallic layer 220 is preferably formed of at least one material of Mg, Al, Ti, Zr, Hf, V, Nb, Ta, and Cr or a combined material thereof, but is not necessarily limited thereto. When these materials are formed of oxides, these materials are insulators and have a characteristic of transmitting electrons only through a tunneling phenomenon without conducting the electrons.

The heat treatment step (S220) performs an operation of heat-treating the initial multilayer structure 20.

In the heat treatment step (S220), the heat treatment is preferably performed by a thermal annealing method but is not necessarily limited thereto.

In the heat treatment step (S220), when the heat treatment is performed by the thermal annealing method, the annealing may be treated under a temperature condition of 300° C. to 500° C. and a time duration of 1 hr to 5 hr.

In the device forming step (S230), after the heat treatment, the initial multilayer structure 20 is converted to a final multilayer structure 21 and a magnetic tunnel junction device of the final multilayer structure 21 is formed. Specifically, in the device forming step (S230), at least one metallic oxide layer and the metallic layer are transformed to at least one ferromagnetic material layer and the oxide layer by heat treatment, respectively, to form the magnetic tunnel junction device of the final multilayer structure 21. Here, the final multilayer structure 21 includes a first ferromagnetic material layer 212, an oxide layer 222, and a second ferromagnetic material layer 232.

That is, in the device forming step (S230), the first metallic oxide layer 210 and the second metallic oxide layer 230 are converted to the first ferromagnetic material layer 212 and the second ferromagnetic material layer 232 by heat treatment, respectively, and the metallic layer 220 is converted to the oxide layer 222.

In the device forming step (S230), the first metallic oxide layer 210 and the second metallic oxide layer 230 cause a reduction reaction by heat treatment. The first metallic oxide layer 210 and the second metallic oxide layer 230 may be formed of metallic oxide that is converted into a ferromagnetic material (FM) layer by a reduction reaction. The first metallic oxide layer 210 and the second metallic oxide layer 230 are formed of at least one material of NiOx, FeOx, FeNiOx, CoNiOx, CoOx (e.g., CoO, $Co_2O_3$, $Co_3O_4$), CoFeBOx, CoFeOx, etc. or a combined material thereof, and the first ferromagnetic material layer 212 and the second ferromagnetic material layer 232 may be reduced to at least one material of Ni, Fe, FeNi, CoNi, Co, CoFeB, CoFe or a combined material thereof.

In the device forming step (S230), the metallic layer 220 is transformed to the oxide layer 222 by an oxidation reaction during the heat treatment. The metallic layer 220 is converted to the oxide layer 222 by receiving oxygen emitted by the reduction reaction of the first metallic oxide layer 210 and the second metallic oxide layer 230. Here, the metallic layer 220 may be formed of at least one material of Mg, Al, Ti, Zr, Hf, V, Nb, Ta, Cr, etc., or a combined material thereof, and the oxide layer 222 may be formed of at least one material of MgOx, AlOx, TiOx, ZrOx, HfOx, VOx, NbOx, TaOx, CrOx, etc., or a combined material thereof. These oxides are insulators and materials capable of transmitting electrons only through a tunneling phenomenon without conducting the electrons.

In the magnetic tunnel junction device of the final multilayer structure 21, the first ferromagnetic material layer 212 and the second ferromagnetic material layer 232 are formed with a thickness of 1 nm to 3 nm, and the oxide layer 222 is preferably formed with a thickness of 0.5 nm to 2 nm.

FIG. 3 is a diagram illustrating a structure of a magnetic tunnel junction device according to an exemplary embodiment of the present invention.

The magnetic tunnel junction device according to the exemplary embodiment may further include perpendicular magnetization inductive layers 310 and 312, a protective layer 320 and a seed layer 322.

FIG. 3A is a cross-sectional view illustrating that the perpendicular magnetization inductive layers 310 and 312, the protective layer 320 and the seed layer 322 are further formed in the initial multilayer structure 20 before the heat treatment, and FIG. 3B is a cross-sectional view illustrating that the perpendicular magnetization inductive layers 310 and 312, the protective layer 320 and the seed layer 322 are further formed in the final multilayer structure 21 after the heat treatment.

The perpendicular magnetization inductive layers 310 and 312 serve to induce the magnetization to be perpendicularly generated and are preferably formed of Pt and Pd materials but are not necessarily limited thereto.

The protective layer 320 and the seed layer 322 serve to protect the multilayer structure and grow to a required texture, and are formed of a material such as Ru, Ta, Mo, Ti, TiN, and the like, but are not necessarily limited thereto.

FIGS. 4 and 5 are diagrams illustrating an oxygen diffusion direction and a device example of a magnetic tunnel junction device to which the perpendicular magnetization inductive layers 310 and 312 and oxygen suction metallic layers 323 and 325 are applied.

Referring to FIG. 4, the oxygen suction metallic layers 323 and 325 may be the protective layer 320 and the seed layer 322 of FIG. 3 and are converted to the oxide layers 324 and 326 by heat treatment.

The first oxide layer 326 may be formed of oxide by suctioning oxygen diffused from the first metallic oxide layer 210 to the oxygen suction metallic layer 325 during the heat treatment. In addition, the second oxide layer 324 may be formed of oxide by suctioning oxygen diffused from the second metallic oxide layer 230 to the oxygen suction metallic layer 323 during the heat treatment.

FIG. 5A illustrates an example of a magnetic tunnel junction device added with the perpendicular magnetization inductive layers 310 and 312 and the oxygen suction metallic layers 323 and 325, and FIG. 5B illustrates its magnetic hysteresis loop measured after heat treatment.

The perpendicular magnetization inductive layers 310 and 312 may be formed of Pt and Pd materials and the like.

The oxygen suction metallic layers 323 and 325 may be formed of a material such as Ru, Ta, Mo, Ti, TiN, and the like.

On the other hand, the thickness of each of the oxygen suction metallic layers 323 and 325 is preferably formed to be 1.5 times larger than the thickness of each of the first perpendicular magnetization inductive layer 310 and the second perpendicular magnetization inductive layer 312.

FIG. 6 is a flowchart for describing a method for manufacturing a magnetic tunnel junction device according to an exemplary embodiment of the present invention.

A manufacturing apparatus for manufacturing the magnetic tunnel junction device deposits the first metallic oxide layer 210 (S410).

In step S420, when the metallic layer 220 is deposited, the manufacturing apparatus for manufacturing the magnetic tunnel junction device deposits the metallic layer 220 or the oxide layer 222 on the first metallic oxide layer 210 (S420). Thereafter, the manufacturing apparatus for manufacturing the magnetic tunnel junction device deposits the second metallic oxide layer 230 on the metallic layer 220 (S430). Here, the first metallic oxide layer 210 and the second metallic oxide layer 230 are formed of at least one material of NiOx, FeOx, FeNiOx, CoNiOx, CoOx (e.g., CoO, $Co_2O_3$, $Co_3O_4$), CoFeBOx, CoFeOx, etc. or a combined material thereof, and the metallic layer 220 is preferably formed of at least one material of Mg, Al, Ti, Zr, Hf, V, Nb, Ta, and Cr or a combined material thereof, but is not necessarily limited thereto. When these materials are formed of oxides, these materials are insulators and have a characteristic of transmitting electrons only through the tunneling phenomenon without conducting the electrons.

In each of steps S410 and S430, it is disclosed that the metallic oxide layers 210 and 230 are deposited, but is not necessarily limited thereto, and only in one of the two steps, the metallic oxide layer may also be laminated.

The manufacturing apparatus for manufacturing the magnetic tunnel junction device performs a heat treatment step of heat-treating the initial multilayer structure 20 laminated in the order of the first metallic oxide layer 210, the metallic layer 220 and the second metallic oxide layer 230 (S440). In the heat treatment step (S440), the heat treatment is preferably performed by a thermal annealing method but is not necessarily limited thereto. In the heat treatment step (S440), when the heat treatment is performed by the thermal annealing method, the annealing may be treated under a temperature condition of 300° C. to 500° C. and a time duration of 1 hr to 5 hr.

The manufacturing apparatus for manufacturing the magnetic tunnel junction device performs a device forming step of converting the initial multilayer structure 20 to the final multilayer structure 21 after heat treatment and forming the magnetic tunnel junction device of the final multilayer structure 21 (S450).

Specifically, in the device forming step (S450), at least one metallic oxide layer and the metallic layer are converted to at least one ferromagnetic material layer and the oxide layer by heat treatment, respectively, to form the magnetic tunnel junction device of the final multilayer structure 21. Here, the final multilayer structure 21 includes a first ferromagnetic material layer 212, an oxide layer 222, and a second ferromagnetic material layer 232.

In the device forming step (S450), the first metallic oxide layer 210 and the second metallic oxide layer 230 are converted to the first ferromagnetic material layer 212 and the second ferromagnetic material layer 232 by heat treatment, and the metallic layer 220 is converted to the oxide layer 222. Here, the first ferromagnetic material layer 212 and the second ferromagnetic material layer 232 may be formed of at least one material of Ni, Fe, FeNi, CoNi, Co, CoFeB, CoFe, and the like or a combined material thereof, and the oxide layer 222 may be formed of at least one of MgOx, AlOx, TiOx, ZrOx, HfOx, VOx, NbOx, TaOx, CrOx, and the like or a combined material thereof. These oxides are insulators and materials capable of transmitting electrons only by a tunneling phenomenon without conducting the electrons.

Meanwhile, in step S420, when the oxide layer 222 is laminated, after step S430 is performed, as illustrated in FIG. 4, the perpendicular magnetization inductive layers 310 and 312 and the oxygen suction metallic layers 323 and 325 are further laminated.

Thereafter, the heat treatment of step S440 is performed. In the heat treatment process of step S440, the oxygens of the first metallic oxide layer 210, and of the second metallic oxide layer 230 are diffused to the oxygen suction metallic layers 323 and 325, and the oxygen suction metallic layers 323 and 325 are converted to the oxide layers 324 and 326.

In FIG. 6, each step is described to be sequentially executed, but it is not necessarily limited thereto. In other words, since the steps described in FIG. 6 are changed and performed or one or more steps are performed in parallel, FIG. 6 is not limited to the time-series order.

FIG. 7 is a diagram for describing a magnetic tunnel junction device and a method of manufacturing the same according to another exemplary embodiment of the present invention.

The magnetic tunnel junction device according to another exemplary embodiment of the present invention has a difference in the lamination step S210 and the device forming step S230 from the magnetic tunnel junction device of FIG. 2. In FIG. 7, the contents for such a difference are mainly described, and the duplicated contents with the manufacturing method of the magnetic tunnel junction device described in FIG. 2 will be omitted.

FIG. 7A illustrates an initial multilayer structure 22 before the heat treatment, and FIG. 7B illustrates a final multilayer structure 23 after the heat treatment.

The initial multilayer structure 22 includes a first metallic oxide layer 210, a second metallic oxide layer 230, a first metallic layer 220a, an immediate metallic layer 221, and a second metallic layer 220b.

In the laminating step according to another exemplary embodiment of the present invention, the first metallic oxide layer 210, the first metallic layer 220a, the immediate metallic layer 221, the second metallic layer 220b, and the second metallic oxide layer 230 are laminated in sequence to form the initial multilayer structure 22.

The first metallic oxide layer 210 and the second metallic oxide layer 230 are formed of at least one material of NiOx, FeOx, FeNiOx, CoNiOx, CoOx (e.g., CoO, $Co_2O_3$, $Co_3O_4$), CoFeBOx, CoFeOx, etc. or a combined material thereof, and the first metallic layer 220a and the second metallic layer 220b may be formed of at least one material of Mg, Al, Ti, Zr, Hf, V, Nb, Ta, and Cr or a combined material thereof. Further, the immediate metallic layer 221 may be formed of at least one material of Mg, Al, Ti, Zr, Hf, V, Nb, Ta, and Cr, or a combined material thereof. Since these materials are formed of oxides, these materials are insulators and have a characteristic of transmitting electrons only through the tunneling phenomenon without conducting the electrons. At this time, the oxide heat of formation for oxidizing the immediate metallic layer 221 is preferably smaller than the heat of formation required for oxidizing the first metallic layer 220a and the second metallic layer 220b. It is meant that as the small heat of formation is a negative number, the absolute value is greater. Therefore, since the immediate metallic layer 221 has the affinity to oxygen much higher than the first metallic layer 220a and the second metallic layer 220b, the immediate metallic layer 221 may serve to attract well oxygen emitted and to help the oxide formation when the first metallic oxide layer 210 and the second metallic oxide layer 230 are reduced.

In the device forming step according to another exemplary embodiment of the present invention, after the heat treatment, the initial multilayer structure 22 is converted to the final multilayer structure 23 and a magnetic tunnel junction device of the final multilayer structure 23 is formed. Specifically, in the device forming step, at least one metallic oxide layer and the metallic layer are converted to at least one ferromagnetic material layer and an oxide layer by heat treatment to form the magnetic tunnel junction device of the final multilayer structure 23. Here, the final multilayer structure 23 includes a first ferromagnetic material layer 212, a first oxide layer 222a, an intermediate oxide layer 223, a second oxide layer 222b, and a second ferromagnetic material layer 232.

That is, in the device forming step, the first metallic oxide layer 210 and the second metallic oxide layer 230 are reduced to the first ferromagnetic material layer 212 and the second ferromagnetic material layer 232 by the heat treatment, and the first metallic layer 220a, the immediate metallic layer 221 and the second metallic layer 220b are oxidized to the first oxide layer 222a, the intermediate oxide layer 223 and the second oxide layer 222b, respectively. Here, the immediate metallic layer 221 is preferably formed of a material having high oxygen affinity than the materials of the first metallic layer 222a and the second metallic layer 222b.

In the device forming step, in the first oxide layer 222a, the intermediate oxide layer 223, and the second oxide layer 222b, the oxidation reaction occurs by heat treatment. The first metallic layer 220a, the immediate metallic layer 221 and the second metallic layer 220b are oxidized to the first oxide layer 222a, the intermediate oxide layer 223 and the second oxide layer 222b by receiving oxygens emitted by the reduction reaction of the first metallic oxide layer 210 and the second metallic oxide layer 230. Here, the first oxide layer 222a and the second oxide layer 222b are formed of at least one material of MgOx, AlOx, TiOx, ZrOx, HfOx, VOx, NbOx, TaOx, CrOx, and the like or a combined material, and the intermediate oxide layer 223 may be formed of at least one material of MgOx, AlOx, TiOx, ZrOx, HfOx, VOx, NbOx, TaOx, CrOx, and the like or a combined material thereof. These oxides are insulators and materials capable of transmitting electrons only by a tunneling phenomenon without conducting the electrons.

In the magnetic tunnel junction device of the final multilayer structure 23, the first ferromagnetic material layer 212 and the second ferromagnetic material layer 232 are formed with a thickness of 1 nm to 3 nm, and the oxide layer including the first oxide layer 222a, the intermediate oxide layer 223 and the second oxide layer 222b is preferably formed with a thickness of 0.5 nm to 2 nm.

FIG. 8 is a flowchart for describing a method for manufacturing a magnetic tunnel junction device according to another exemplary embodiment of the present invention.

A manufacturing apparatus for manufacturing the magnetic tunnel junction device according to another exemplary embodiment of the present invention deposits the first metallic oxide layer 210 (S610). Thereafter, the manufacturing apparatus for manufacturing the magnetic tunnel junction device deposits the first metallic layer 220a on the first metallic oxide layer 210 (S620), deposits the immediate metallic layer 221 on the first metallic layer 220a (S622), and deposits the second metallic layer 220b on the immediate metallic layer 221 (S624).

Thereafter, the manufacturing apparatus for manufacturing the magnetic tunnel junction device deposits the second metallic oxide layer 230 on the second metallic layer 220b (S630). Here, the first metallic oxide layer 210 and the second metallic oxide layer 230 are formed of at least one material of NiOx, FeOx, FeNiOx, CoNiOx, CoOx (e.g., CoO, $Co_2O_3$, $Co_3O_4$), CoFeBOx, CoFeOx, etc. or a combined material thereof, and the first metallic layer 220a and the second metallic layer 220b may be preferably formed of at least one material of Mg, Al, Ti, Zr, Hf, V, Nb, Ta, Cr, and the like or a combined material thereof. Further, the immediate metallic layer 221 may be formed of at least one material of Mg, Al, Ti, Zr, Hf, V, Nb, Ta, Cr, and the like or a combined material thereof. Here, the immediate metallic layer 221 is preferably formed of a material having oxygen affinity higher than the materials of the first metallic layer 222a and the second metallic layer 222b. When these materials are formed of oxides, these materials are an insulator and have a characteristic of transmitting electrons only through a tunneling phenomenon without conducting the electrons.

The manufacturing apparatus for manufacturing the magnetic tunnel junction device performs a heat treatment step of heat-treating the initial multilayer structure 22 laminated in the order of the first metallic oxide layer 210, the first metallic layer 220a, the immediate metallic layer 221, the second metallic layer 220b, and the second metallic oxide layer 230 (S640). In the heat treatment step (S220), the heat treatment is preferably performed by an annealing method but is not necessarily limited thereto. In the heat treatment step (S640), when the heat treatment is performed by the thermal annealing method, the annealing may be treated under a temperature condition of 300° C. to 500° C. and a time duration of 1 hr to 5 hr.

The manufacturing apparatus for manufacturing the magnetic tunnel junction device performs a device forming step of converting the initial multilayer structure 22 to the final multilayer structure 23 after heat treatment and forming the magnetic tunnel junction device of the final multilayer structure 23 (S650).

Specifically, in the device forming step (S650), at least one metallic oxide layer and the metallic layer are converted to at least one ferromagnetic material layer and the oxide layer by heat treatment to form the magnetic tunnel junction device of the final multilayer structure 23. Here, the final multilayer structure 23 includes the first ferromagnetic material layer 212, the first oxide layer 222a, the intermediate oxide layer 223, the second oxide layer 222b, and the second ferromagnetic material layer 232.

In the device forming step (S650), the first metallic oxide layer 210 and the second metallic oxide layer 230 are reduced to the first ferromagnetic material layer 212 and the second ferromagnetic material layer 232 by the heat treatment, and the first metallic layer 220a, the immediate metallic layer 221 and the second metallic layer 220b are oxidized to the first oxide layer 222a, the intermediate oxide layer 223 and the second oxide layer 222b, respectively.

Here, the first ferromagnetic material layer 212 and the second ferromagnetic material layer 232 may be formed of at least one material of Ni, Fe, FeNi, CoNi, Co, CoFeB, CoFe, and the like, or a combined material thereof, the first oxide layer 222a and the second oxide layer 222b are formed of at least one material of MgOx, AlOx, TiOx, ZrOx, HfOx, VOx, NbOx, TaOx, CrOx, and the like, or a combined material thereof, and the intermediate oxide layer 223 may be formed of at least one material of MgOx, AlOx, TiOx, ZrOx, HfOx, VOx, NbOx, TaOx, CrOx, and the like, or a combined material thereof. These oxides are insulators and materials capable of transmitting electrons only by a tunneling phenomenon without conducting the electrons.

In FIG. 8, each step is described to be sequentially executed, but it is not necessarily limited thereto. In other words, since the steps described in FIG. 8 are changed and performed or one or more steps are performed in parallel, FIG. 8 is not limited to the time-series order.

FIG. 9 is a diagram for describing an interface structure of the magnetic tunnel junction device according to the exemplary embodiment of the present invention.

FIG. 9A illustrates a structure of a magnetic tunnel junction device in the related art, and FIG. 9B illustrates a structure of a magnetic tunnel junction device according to the exemplary embodiment.

As the magnetic tunnel junction device in the related art is manufactured using a sputtering method or an oxidization method (natural oxidization, plasma oxidization, etc.), conventional interfaces 710 and 712 located on and below the conventional oxide layer 122 include the conventional first ferromagnetic material layer 112 and the conventional second ferromagnetic material layer 132. By these conventional interfaces 710 and 712, in the conventional magnetic tunnel junction device, the intermixing of atoms occurs at a certain reference or more, and the coherent tunneling performance may be degraded by the intermixing.

On the contrary, the magnetic tunnel junction device of the present invention is manufactured only though the heat treatment after laminating the initial multilayer structure to minimize that the first ferromagnetic material layer 212 and the second ferromagnetic material layer 232 are included in interfaces 720 and 722 located on and below the oxide layer 222. By these interfaces 720 and 722, in the magnetic tunnel junction device of the present invention, the intermixing of atoms occurs at less than a certain reference, and the coherent tunneling performance may be improved by the intermixing.

FIG. 10 is a diagram illustrating a result of measuring the roughness of interfaces and the interlayer structure of the magnetic tunnel junction device according to the exemplary embodiment of the present invention.

FIG. 10 is a diagram illustrating verifying that the quality of the interface has been improved the present invention (reduction and oxidation reactions).

Clarity of the roughness of the interface and a physical boundary between individual laminated structures may be measured using an x-ray reflectivity method. In FIG. 10, it can be seen that the structure in which the oxidation and the reduction reactions occurred by heat treatment at 300° C. is clearer in oscillating peaks and smaller in the entire slope than other structures. This is because the interface between the layers is clearly defined, and the roughness of the interface is small. It is verified that the quality of the interface has been improved by oxidation and reduction reactions. On the other hand, the improvement of the interface quality may be verified as significantly increased interfacial (Ks) energy to be described below.

The average surface roughness of each of the interface between the first ferromagnetic material layer 212 and the oxide layer 222 and the interface between the second ferromagnetic material layer 232 and the oxide layer 222 of the magnetic tunnel junction device may be included within the range of 0.1 nm to 0.8 nm. Here, the average surface roughness may calculate the average of the surface roughness measured in a predetermined scope.

FIGS. 11 and 12 are diagrams illustrating a structure of a magnetic tunnel junction device in the related art and a structure of a magnetic tunnel junction device according to an exemplary embodiment of the present invention.

FIG. 11A illustrates a structure of a magnetic tunnel junction device in the related art.

The structure of the magnetic tunnel junction device in the related art means a structure in which a seed layer (Ru), a first perpendicular magnetization inductive layer (Pd), a first ferromagnetic material layer (Co), an oxide layer (MgO), a second ferromagnetic material layer (Co), a second perpendicular magnetization inductive layer (Pd), and a protective layer (Ru) are formed on a substrate (Sift). Here, the first ferromagnetic material layer (Co), the oxide layer (MgO), and the second ferromagnetic material layer (Co) may be prepared using a sputtering method or oxidation method (natural oxidation, plasma oxidation, etc.).

FIG. 11B illustrates a magnetization measuring result (upper graph) in an in-plane direction and a magnetization measuring result (lower graph) in a perpendicular to-the-plane direction before heat treatment. FIG. 11C illustrates a magnetization measuring result (upper graph) in an in-plane direction and a magnetization measuring result (lower graph) in the perpendicular direction after heat treatment.

FIG. 12 is a diagram illustrating a structure of the initial multilayer structure of the magnetic tunnel junction device according to the exemplary embodiment of the present invention.

The initial multilayer structure of the magnetic tunnel junction device according to the exemplary embodiment of the present invention means a structure in which a seed layer (Ru), a first perpendicular magnetization inductive layer (Pd), a first metallic oxide layer (CoO), an metallic layer (Mg), a second metallic oxide layer (CoO), a second perpendicular magnetization inductive layer (Pd), and a protective layer (Ru) are formed on a substrate ($SiO_2$).

Here, the first metallic oxide layer (CoO), the metallic layer (Mg), and the second metallic oxide layer (CoO) have a simply laminated structure and are converted to the first ferromagnetic material layer (Co), the oxide layer (MgO), and the second ferromagnetic material layer (Co) when the oxidation and reduction reactions occur by heat treatment.

FIGS. 13A and 13B are diagrams illustrating experimental results based on a heat treatment temperature of the magnetic tunnel junction device according to the exemplary embodiment of the present invention.

FIGS. 13A and 13B illustrate experimental results of measuring magnetization mz in a perpendicular direction by changing an annealing temperature condition to 300° C., 400° C. and 500° C., respectively. Here, it is preferred that the intensity of a perpendicular magnetic field (Hz) in the heat treatment is 1.5 kOe, and the heat treatment duration is 2 hr. In the initial multilayer structure of the magnetic tunnel junction device, it is not observed, which indicates a magnetization value is zero. However, magnetization values are shown and a magnetic hysteresis loop as a characteristic of the ferromagnetic material is shown by heat treatment. This is verified that the first metallic oxide layer (CoO), the metallic layer (Mg), and the second metallic oxide layer (CoO) are converted to the first ferromagnetic material layer (Co), the oxide layer (MgO), and the second ferromagnetic material layer (Co) when the oxidation and reduction reactions occur by heat treatment.

The temperature condition for manufacturing the magnetic tunnel junction device according to the exemplary embodiment of the present invention is preferably a temperature condition of 300° C. to 500° C. but is not necessarily limited thereto.

FIGS. 14A to 14C are diagrams illustrating experimental results based on heat treatment duration of the magnetic tunnel junction device according to the exemplary embodiment of the present invention.

FIGS. 14A and 14B illustrate experimental results of measuring magnetization in a perpendicular direction by changing an annealing duration to 1 hr to 5 hr, respectively. Here, it is preferred that the intensity of a perpendicular magnetic field in the heat treatment is 1.5 kOe, and the heat treatment temperature is 400° C. In the initial multilayer structure of the magnetic tunnel junction device, a magnetization value is zero. However, magnetization values are shown and a magnetic hysteresis loop as a characteristic of the ferromagnetic material is shown by heat treatment. This is verified that the first metallic oxide layer (CoO), the metallic layer (Mg), and the second metallic oxide layer (CoO) are converted to the first ferromagnetic material layer (Co), the oxide layer (MgO), and the second ferromagnetic material layer (Co) when the oxidation and reduction reactions occur by heat treatment.

Referring to FIG. 14C, the heat treatment duration for manufacturing the magnetic tunnel junction device according to the exemplary embodiment of the present invention is preferably a time duration of 1 hr to 5 hr, and an optimal time duration may be 2 hr to 3 hr but is not necessarily limited thereto.

FIGS. 15A and 15B are diagrams illustrating experimental results based on oxygen flow rates of the magnetic tunnel junction device according to the exemplary embodiment of the present invention. The oxygen is for forming the first ferromagnetic material layer 212 and the second ferromagnetic material layer 232.

FIGS. 15A and 15B illustrate experimental results of measuring magnetization in a perpendicular direction by changing an oxygen rate to 5 sccm, 10 sccm, 20 sccm, 30 sccm, 40 sccm, and 50 sccm in the process of manufacturing the magnetic tunnel junction device, respectively.

In FIG. 15A, it is preferred that the heat treatment temperature is 375° C., the intensity of the perpendicular magnetic field is 1.5 kOe, and the heat treatment duration is 5 hr, and in FIG. 15B, it is preferred that the heat treatment temperature is 400° C., the intensity of the perpendicular magnetic field is 1.5 kOe, and the heat treatment duration is 1 hr.

Referring to the experimental results of FIGS. 15A and 15B, in the process of manufacturing the magnetic tunnel junction device, when the oxygen flow rate is 5 sccm to 20 sccm, the optimal magnetic tunnel junction device may be manufactured.

FIGS. 16 to 19 illustrate perpendicular magnetic anisotropy (PMA) according to a reduction reaction of the ferromagnetic material layer (the first ferromagnetic material layer 212 and the second ferromagnetic material layer 232) of the magnetic tunnel junction device according to the exemplary embodiment of the present invention and a thickness of the ferromagnetic material layer.

FIG. 16 is a diagram for describing oxidation and reduction operations for improving the performance of the magnetic tunnel junction device according to the exemplary embodiment of the present invention, FIGS. 18 and 19 are diagrams illustrating an experimental result of changes in magnetic properties when varying a change in thickness of the reduced ferromagnetic material in the case of heat treatment according to the exemplary embodiment of the present invention.

In FIGS. 16 to 18, it has been described that it is assumed that the initial multilayer structure is CoO/Pd/Ta, but this is an example for describing the reduction reaction of the ferromagnetic material layer, and the initial multilayer structure and the component materials may be modified to CoO/Pd/Mg, Pd/CoO/Mg, and the like.

The reduction of CoO to Co using vacuum thermal annealing occurs with the enhancement of perpendicular magnetic anisotropy (PMA) in a Co/Pd multilayer and can be contributed to the charge transfer effect at the interface.

In conventional general methods, a critical thickness of the annealed Co/Pd multilayer after laminating is about 1 nm, but according to the exemplary embodiment of the present invention, the oxidation-reduced Co/Pd multilayer was greatly improved in the PMA, and accordingly, a critical thickness ($t_{critical}$=2.90 nm) for the PMA may be much larger. The critical thickness is defined as the minimum thickness in which the perpendicular magnetic anisotropy maintains.

In the reduction process, the oxygen atoms of CoO are diffused through Pd and combined with the Ta atoms to form $Ta_2O_5$.

Since the Co—O—Pd hybridization at the interface of Co and Pd is made due to the residual oxygen generated during the diffusion, the charge transfer effect improves the PMA. In this process, the oxygen diffusion rate in Pd at the interface due to heat treatment plays a significant role in manipulating the magnetic characteristics.

In order to keep information written in an MRAM for a long time or to prevent the information from being damaged due to the heat, it is required to increase the PMA or increase a magnetic volume V in a memory cell. An only method of increasing the magnetic volume without violation of the scaling laws such as the Moore law is to increase a critical thickness of the ferromagnetic material layer. In this case, however, it is difficult to achieve perpendicular magnetization because the bulk magnetic energy is dominated over the interfacial energy when the thickness is thicker than the critical thickness. That is, this is because the demagnetizing energy or demagnetizing field generated in the perpendicular magnetization process is increased. Since the demagnetizing energy is proportional to the square of material magnetization and the PMA is a result of spin-orbit coupling, which is a unique characteristic of the material, it is difficult to increase the critical thickness $t_{critical}$ unless the material itself is changed. If a method for greatly enhancing the PMA without changing the material is developed, the critical thickness tcritical may be increased to secure the retention and thermal stability of the data.

The Co/Pd multilayer capable of having high PMA may be used as an electrode of the ferromagnetic material layer in the magnetic tunnel junction (MTJ), a core unit device of the MRAM. The PMA of the Co/Pd multilayer depends on numerous parameters such as crystallographic orientation and texture, interface smoothness or interlayer mixing, presence of laminating faults, and elastic strain in the Co layer. Above all those issues, a thickness $tc_o$ of the Co layer needs to be less than the critical thickness $t_{critical}$ to maintain the PMA.

If the existing deposition technique is used, the critical thickness tcritical of Co in the Co/Pd multilayer may be implemented within approximately 1 nm. However, since the thickness is too thin, the thickness margin is not large to significantly reduce the mass production yield. Therefore, there is a need for a specific deposition technique capable of precisely controlling the thickness $tc_o$ of the ultra-thin Co layer, and making the critical thickness $t_{critical}$ large.

In the present invention, in the process of forming the metal ferromagnetic material layer using a heat-based reduction reaction of CoO, a method of greatly improving the PMA of the Co/Pd multilayer and obtaining the critical thickness tcritical of abnormally thick Co is achieved.

As shown in FIGS. 18 and 19, Co reduced from CoO had the substantially improved PMA and the critical thickness $t_{critical}$ becomes abnormally as thick as 2.9 nm. Such causes are due to an electronic structure modified by the charge transfer through Co—O—Pd hybridization at the interface of the multilayer, which was made possible by the least intermixing between CoO and Pd before heat treatment and the reduction of Co after heat treatment.

Oxygen impurities in the Co layer located at the interface plays a role in lifting-up degenerated d orbitals of Co to cause different electron states and improve the anisotropy of the electronic structure, which results in the increase of the PMA. That is, it is meant that anisotropic energy may be adjusted with an appropriate impurity (here, oxygen).

By using a method to be claimed in the present invention, it is possible to improve both the thermal stability and the PMA of the ferromagnetic material layer, in addition to the increase of the critical thickness $t_{critical}$. This method may have the strengths, in particular, for applications where FM has to be scaled down.

<Reduction Mechanism According to the Present Invention and its Effect on PMA>

A structure prepared to verify the proposed structure of the present invention is metallic Co/Pd (M-[Co/Pd]), annealed metallic Co/Pd (A-[Co/Pd]), oxidic CoO/Pd (O-[Co/Pd]), and thermally reduced Co/Pd (R-[Co/Pd]), and a multilayer formed between all metallic Ta/Pd. That is, it refers to a multilayer composed of Ta/Pd/Co (one of four types)/Pd/Ta.

FIGS. 16A, 16B, and 16C compare a result of magnetic hysteresis loops of the multilayer with a thickness of Co or CoO of 1 nm at room temperature (20° C.) and after heat-treating at 300° C. for 2 hr. M-[Co/Pd] before heat treatment shows in-plane magnetic anisotropy at room temperature and shows induced PMA after heat treatment (represented by A-[Co/Pd]). The multilayer started with CoO/Pd does not show any magnetic properties before heat treatment, but high PMA is induced after heat treatment (represented by R-[Co/Pd]) as proved in the magnetic hysteresis loops. In-plane loops are represented by a thick line and out-of-plane loops are represented by a thin line. FIG. 16D illustrates a mechanism included in the reduction reaction and FIG. 16E illustrates a reaction diagram showing the heat of oxide formation of Co, Pd, and Ta. Here, it can be seen that $Ta_2O_5$ is formed of very stable oxide as compared with PdO or CoO.

FIG. 16A compares the magnetic hysteresis loops of M-[Co/Pd], A-[Co/Pd], and R-[Co/Pd] when the thickness $tc_o$ of the Co layer is 1 nm. O-[Co/Pd] does not show any magnetic loops as a paramagnetic characteristic.

M-[Co/Pd] shows in-plane magnetic anisotropy (IMA) because 1 nm-thick Co cannot overcome the strong demagnetizing field. It can be seen that the IMA in M-[Co/Pd] is changed to the PMA in A-[Co/Pd] after thermal annealing is performed at a temperature of 300° C. in vacuum, as shown in FIG. 16B.

Referring to FIGS. 16B and 16C, in thermal annealing, paramagnetic O-[Co/Pd] is reduced to a metallic ferromagnetic material. Particularly, the paramagnetic O-[Co/Pd] is reduced to R-[Co/Pd] having large PMA and large coercivity as compared to A-[Co/Pd].

Referring to FIG. 16, it can be seen that an anisotropy field $H_k$ for R-[Co/Pd] is shown as 23 kOe, which is larger by over two times than the anisotropy field $H_k$ for A-[Co/Pd], 9 kOe.

FIG. 17 is a diagram illustrating a result of measuring uniaxial magnetic anisotropic energy of the magnetic tunnel junction device according to the exemplary embodiment of the present invention.

Magnetic anisotropy energy $K_u^{eff}$ may be calculated using its area difference by obtaining in-plane and perpendicular magnetic hysteresis curves. In the exemplary embodiment, the magnetic anisotropy energy $K_u^{eff}$ was calculated by such an M-H area calculation method (FIG. 17A).

The magnetic anisotropy energy $K_u^{eff}$ may also be measured by using a General Suck-Smith Thomson (GST) method (FIG. 17B) after patterning the specimen in a Hall bar shape (W. Sucksmith and J. E. Thompson, Proc. R. Soc. London, Ser. A 225, 362 (1954). https://doi.org/10.1098/rspa.1954.0209).

In the experiment, the magnetic anisotropy energy $K_u^{eff}$ was measured using the two methods. Referring to FIG. 17C, the effective uniaxial magnetic anisotropy energy $K_u^{eff}$ calculated using the area method of the magnetic hysteresis curve for R-[Co/Pd] at the thickness $tc_o$ of 1 nm of the Co layer is calculated as $1.27 \times 10^7$ erg/cm$^3$, which is measured as at least twice larger than the effective uniaxial magnetic anisotropy energy $K_u^{eff}$ for A-[Co/Pd], $6.84 \times 10^6$ erg/cm$^3$. It was confirmed that the strength of the uniaxial magnetic anisotropy energy measured by a GST method was similar to that measured by the area method. For reference, when describing existing reported values for comparison, when the thickness of Co is 0.7 nm, it is reported that the uniaxial magnetic anisotropy energy $K_u^{eff}$ is $8 \times 10^6$ erg/cm$^3$ [Phys. Rev. B 79, 024423 (2009)] and when the thickness of Co is 0.3 nm, the magnetic anisotropy energy $K_u^{eff}$ is $3.4 \times 10^6$ erg/cm$^3$ [Appl. Phys. Lett., 104, 022404 (2014)], respectively, and it can be seen that Co reduced through the heat treatment has very large uniaxial magnetic anisotropy energy $K_u^{eff}$.

The mechanism involved in the reduction process by vacuum thermal annealing for the multilayers is illustrated in FIG. 16D. In the proposed mechanism, oxygen atoms are diffused from CoO to Ta and the reduced metallic Co layer is left because of a steep gradient of oxygen affinity to Ta. It can be seen that the smaller the heat of formation for oxidation as a negative value, the larger the oxygen affinity.

The proposed mechanism is described by the thermodynamics reactions during the thermal annealing. FIG. 16E illustrates the heat of formation converting Co, Pd, and Ta to their oxides such as CoO, PdO, and $Ta_2O_5$, respectively. According to the heat of formation, $Ta_2O_5$ is the most stable oxide among all the deposited layers.

The directional migration of oxygen is proven by x-ray photoelectron spectroscopy (XPS) and coincides with the proposed mechanism.

The XPS spectrum of R-[Co/Pd] indicates the formation of oxidic Ta (i.e., $Ta_2O_5$), along with the reduction of CoO to metallic Co after annealing. Additionally, in the case of R-[Co/Pd], the presence of shoulder peak of Co 2p peak indicates that there is residual oxide in reduced Co. The interface defined clearly due to the result of the reduction and the existence of the residual oxygen may greatly improve the PMA of the multilayer through strong spin-orbit coupling (SOC).

<Effect of Annealing According to Heat Treatment Temperature>

FIG. 18 illustrates changes in magnetic properties of O-[Co/Pd], M-[Co/Pd], A-[Co/Pd] and R-[Co/Pd] when the thickness $tc_o$ of the Co layer is changed.

FIG. 18 illustrates a magnetic hysteresis curve (M-H curve) or magnetic hysteresis loops measured in in-plane $H_x$ and perpendicular $H_z$ directions before and after thermal annealing at a heat treatment temperature Ta, 300° C. FIGS. 18A, 18C, and 18E illustrate graphs measured in the in-plane $H_x$ direction and FIGS. 18B, 18D, and 18F illustrate graphs measured in the perpendicular $H_z$ direction. O-[Co/Pd], M-[Co/Pd], A-[Co/Pd] and R-[Co/Pd] are represented by the thickest line, a thin line, a thick line, a dot-dash line, respectively.

To investigate the effect of thermal annealing at 300° C. on the magnetic properties, [Co/Pd] having various thicknesses $tc_o$ (i.e., 1, 2, and 3 nm) of the Co layer are examined in the in-plane and perpendicular directions before and after annealing.

As shown in the magnetic hysteresis curve (M-H curve) in FIG. 18, the M-[Co/Pd] (a thin line) increases linearly from 110 to 305 μemu with the thickness $tc_o$ of the Co layer from 1 to 3 nm. It is also found that A-[Co/Pd] ($m_A$=117 μemu) is slightly increased as compared with M-[Co/Pd] ($m_m$=110 μemu).

Except for a case where the thickness $tc_o$ of the Co layer is 1 nm in A-[Co/Pd], in the thickness of other A-[Co/Pd], after thermal annealing, the perpendicular magnetic anisotropy is lost and it returns to the in-plane magnetic anisotropy (IMA).

On the other hand, since the deposited O-[Co/Pd] for all the thickness $tc_o$ of the Co layer show no magnetic moments, it may be confirmed that the oxidic physical paramagnet of Co is formed. The magnetic properties of R-[Co/Pd] are obtained upon thermal annealing and the thermal annealing enables the phase transformation from oxidic paramagnet to metallic ferromagnet.

The recovery rate (defined as R (%)=$m_R/m_A$×100) for R-[Co/Pd] at the thickness $tc_o$ of the Co layer of 1 nm is confirmed to be at least 96% and consistent for the thickness $tc_o$ of all other Co layers.

It can be seen that when the thickness $tc_o$ of the Co layer is 1 nm, the PMA in R-[Co/Pd] is stronger that that in A-[Co/Pd]. The effective uniaxial PMA energy $K_u^{eff}$ of R-[Co/Pd] is calculated to $1.27\times10^7$ $erg/cm^3$, whereas M-[Co/Pd] shows $6.84\times10^6$ $erg/cm^3$ after annealing and exhibits the IMA (i.e., A-[Co/Pd]). Both types of multilayers have a squareness ($m_r/m_s$) of 1.

R-[Co/Pd] shows coercivity $H_c$ ($H_c$=3 kOe) much higher than the other type of [Co/Pd] at the same thickness $tc_o$ of the Co layer. A significant increase in the coercivity $H_c$ may be attributed to a change in internal structure due to the residual oxygen impurities, which consequently affects the motion of the magnetic domain wall.

When the thickness $tc_o$ of the Co layer is 2 nm or thicker, A-[Co/Pd] shows the IMA, while it can be seen that even when the thickness $tc_o$ of the Co layer is 2 nm, R-[Co/Pd] shows the PMA because the effective uniaxial PMA energy $K_u^{eff}$ is high as $6.94\times10^6$ $erg/cm^3$ (see FIGS. 18C and 18D). It is important that this value also shows the effective uniaxial PMA energy $K_u^{eff}$ higher than any reported values. The critical thickness $t_{critical}$ for PMA is confirmed to be 2.9 nm (see FIG. 19). and when the thickness $tc_o$ of the Co layer is 3 nm, R-[Co/Pd] shows the IMA (see FIGS. 18E and 18F). That is, all multilayers with the thickness $tc_o$ of 3 nm or higher of the Co layer show the IMA.

<Effect of Reduction for PMA of Multilayers>

The effective uniaxial magnetic anisotropy $K_u^{eff}$ may be evaluated by changing the thickness $tc_o$ of the Co layer in the multilayers. The annealing result at a heat treatment temperature $T_a$ of 300° C. by varying the thickness $tc_o$ of the Co layer in the multilayers was illustrated in Table 1 below and FIG. 14B. The effective uniaxial magnetic anisotropy $K_u^{eff}$ may be dissociated into volume anisotropy energy $K_v$ and interfacial anisotropy energy Ks components by fitting a graph of $tc_o$ vs. $tc_o$ using a calculating equation, Equation $K_u^{eff}=-2\pi M_x^2+K_v+2 K_s tc_o$. The interfacial $K_s$ energy is the source energy of PMA and obtains high PMA when the energy is large. As a result of the experiment, the analysis values for the graph of FIG. 19 were summarized in Table 1 and compared with the numerical values in the documents that others have reported.

TABLE 1

| Multilayers | Substrate | $K_v$ (erg/cm²) | $K_u^{eff}$ (Merg/cm³) | $t_{critical}$ nm | Depositing techniques |
|---|---|---|---|---|---|
| M-[Co/Pd] | SiO₂/Ta | 0.40 | −9.12 | 0.88 | DC-sputter |
| A-[Co/Pd] | SiO₂/Ta | 0.82 | −10.70 | 1.50 | DC-sputter |
| R-[Co/Pd] | SiO₂/Ta | 1.05 | −7.31 | 2.90 | DC-sputter |
| Co/Pd | Pd(111) | 0.92 | −10.00 | 1.84 | MBE[39] |
| Co/Pd superlattice | Glass/Pd | 0.25 | −6.40 | 0.78 | DC-sputter[29] |
| Co/Pd superlattice | Glass/Pd | 0.41 | −9.00 | 0.91 | RF-sputter[11] |

([11]Carcia, P. F., Meinhaldt, A. D. & Suna, A. Perpendicular magnetic anisotropy in Pd/Co thin film layered structures. Appl. Phys. Lett. 47, 178 (1985).
[29]Hashimoto, S., Ochiai, Y. & Aso, K. Perpendicular magnetic anisotropy and magnetostriction of sputtered Co/Pd and Co/Pt multilayered films. J. Appl. Phys. 66, 4909 (1989).
[39]Purcell, S. T., Johnson, M. T., McGee, N. W. E., Zeper, W. B. & Hoving, W. Spatially resolved magneto-optical investigation of the perpendicular anisotropy in a wedge-shaped ultrathin epitaxial Co layer on Pd(111). J. Magn. Magn. Mater. 113, 257 (1992).)
A positive $t_{Co} \cdot K_u^{eff}$ value indicates PMA in the multilayers, whereas a negative $t_{Co} \cdot K_u^{eff}$ value indicates IMA.

In Table 1, the interfacial energy value ($K_s$) of A-[Co/Pd] was increased by more than twice over that of M-[Co/Pd]. This enhancement is because Co and Pd intermixed at the interface are separated during annealing, and thus the interface becomes clearer and the defects are reduced. This is due to the intermixing of Co and Pd that which is unavoidably occurred during the sputter-deposition of M-[Co/Pd]. A-[Co/

Pd] has improved Co/Pd interface quality so that the interfacial energy value becomes higher than that of M-[Co/Pd].

Consequently, the critical thickness tcritical for PMA is shown to be increased from 0.88 nm of M-[Co/Pd] to 1.50 nm of A-[Co/Pd] after the thermal annealing.

In the case of R-[Co/Pd], even though the effective bulk energy $K_v^{eff}$ is significantly smaller than M-[Co/Pd], A-[Co/Pd], or other reported values, the interfacial energy $K_s$ is increased by ~3 times larger than the value of the M-[Co/Pd]. It can be seen that the interfacial energy value is even higher than that found in Co prepared by a molecular beam epitaxy method to induce the strong PMA.

As a result, the critical thickness $t_{critical}$ is confirmed as 2.90 nm in R-[Co/Pd], which is approximately three times thicker than that of M-[Co/Pd]. Actually, it is not reported that the PMA is induced at a large thickness of Co 2.9 nm. Accordingly, when all of these analyzed energy and the Co thickness are considered, the uniaxial PMA energy is shown the largest $1.27 \times 10^7$ erg/cm$^3$ in R-[Co/Pd], and thus, it can be seen that the strong uniaxial PMA is induced in the structure where the reduction and oxidation reactions occur.

<Conclusion for the Present Experiment>

The present invention provides a method for synthesizing an improved PMA material by removing oxygen in the material and using the residual oxygen at the interface. According to the proposed method of the present invention, it may be confirmed that during the thermal annealing, paramagnetic oxide CoO is reduced to ferromagnetic metallic Co by oxygen migration to the Ta layer without an additional reducing agent (e.g., $H_2$) or plasma treatment.

The oxygen left during the migration leads to the charge transfer effect through the hybridization of Co—O—Pd at the interface, which eventually has a large effect on the PMA of multilayers. As a result, R-[Co/Pd] shows largely increased PMA energy ($1.27 \times 10^7$ erg/cm$^3$).

Consequently, due to the enhancement in PMA, which affects the value of the critical thickness tcritical, in the case of R-[Co/Pd], the critical thickness tcritical with PMA is increased to 2.9 nm.

Accordingly, the R-[Co/Pd] may be a useful material system for the practical devices requiring a strong PMA. The present invention proposes the method for improving the PMA through heat treatment, and such a method may be used for spintronic devices such as magnetic read heads, MRAM, and spin transistors.

Hereinafter, materials and experimental methods for the experiment of the present invention will be described.

In the present invention, a magnetic thin film structure growing step is as follows. All [Co/Pd] multilayers were deposited on thermally oxidized Si/SiO$_2$ substrates with a ultrahigh vacuum sputtering system at a base pressure of less than $3.0 \times 10^{-9}$ Torr. The structure of the multilayer Co/Pd deposited with Co-oxide (O-[Co/Pd]) or metallic Co (M-[Co/Pd] was Ta 4/Pd 3/CoOx tc$_o$ (or Co tc$_o$)/Pd 3/Ta 4(nm). The thickness tc$_o$ of the Co or Co oxide layer was changed from 1 to 5 nm by an interval of 1 nm to investigate the dependence of PMA. Oxygen gas flowed into a sputtering chamber during the sputtering of Co by Ar ion with a fixed flow rate of 10 sccm to grow the oxide phase of Co in O-[Co/Pd]. All multilayers were annealed in a high vacuum of less than $3.0 \times 10^{-6}$ Ton at various annealing temperatures $T_a$.

In the present invention the structural properties of the Co/Pd system are as follows. For investigating a chemical change after annealing, the multilayers were measured with x-ray photoelectron spectroscopy (XPS, Thermo Scientific Inc.). The incident x-ray was used with Al-Kα. The resolution thereof was less than 0.5 eV in the case of Ag 3d$_{5/2}$. The samples were measured under a vacuum of $5 \times 10^{-9}$ Torr. The information of the microstructure of R-[Co/Pd] with the thickness tc$_o$ of the Co layer of 5 nm was analyzed with spherical aberration-corrected transmission electron microscopy (Cs-corrected TEM, JEM-2100F) with 200 keV electron beam.

In the present invention, magnetic properties of the multilayers are as follows. Magnetic measurement was performed at room temperature using a Lakeshore model 7300 vibrating sample magnetometer (VSM) equipped with a 15 kOe magnet. Magnetic hysteresis (m-H) curve for all the multilayers was recorded using VSM to observe the magnetization state. The magnetic moment resolution of VSM is up to $10^{-6}$ emu (electromagnetic unit), and the magnetic field resolution is up to 1 Oe.

In the present invention, Hall measurement was performed as follows. A Hall bar structure was fabricated by e-beam-lithography followed by Ar ion-beam etching. All measurements were performed at room temperature using a custom-built measurement system with an in-plane magnetic field sample rotation holder in a perpendicular direction. A direct current source (Keithley 2400 source-meter) was used to supply current into the hall bar, and a nano-voltmeter (Keithley 2182) was used to measure the DC voltage across the hall cross.

As described above, the exemplary embodiments have been described and illustrated in the drawings and the specification. The exemplary embodiments were chosen and described in order to explain certain principles of the invention and their practical application, to thereby enable others skilled in the art to make and utilize various exemplary embodiments of the present invention, as well as various alternatives and modifications thereof. As is evident from the foregoing description, certain aspects of the present invention are not limited by the particular details of the examples illustrated herein, and it is therefore contemplated that other modifications and applications, or equivalents thereof, will occur to those skilled in the art. Many changes, modifications, variations and other uses and applications of the present construction will, however, become apparent to those skilled in the art after considering the specification and the accompanying drawings. All such changes, modifications, variations and other uses and applications which do not depart from the spirit and scope of the invention are deemed to be covered by the invention which is limited only by the claims which follow.

What is claimed is:

1. A method of manufacturing a magnetic tunnel junction device comprising the steps of:
    a lamination step of forming an initial multilayer structure including at least one metallic oxide layer and a metallic layer on a substrate;
    a heat treatment step of heat-treating the initial multilayer structure; and
    a device forming step of forming a magnetic tunnel junction device of a final multilayer structure in which at least one metallic oxide layer and the metallic layer are converted into at least one ferromagnetic material layer and the oxide layer by heat treatment.

2. The method of manufacturing the magnetic tunnel junction device of claim 1, wherein the initial multilayer structure includes a first metallic oxide layer, a second metallic oxide layer, and a metallic layer, and in the lamination step, the first metallic oxide layer, the metallic layer, and the second metallic oxide layer are laminated in sequence to form the initial multilayer structure.

3. The method of manufacturing the magnetic tunnel junction device of claim 2, wherein the at least metallic oxide layer is formed of at least one material of NiOx, FeOx, FeNiOx, CoNiOx, CoOx, CoFeBOx, and CoFeOx, or a combined material thereof, and
the metallic layer is formed of at least one material of Mg, Al, Ti, Zr, Hf, V, Nb, Ta, and Cr or a combined material thereof.

4. The method of manufacturing the magnetic tunnel junction device of claim 2, wherein the first metallic oxide layer and the second metallic oxide layer cause a reduction reaction by the heat treatment and are formed of metallic oxide that is converted into a ferromagnetic material (FM) layer by the reduction reaction.

5. The method of manufacturing the magnetic tunnel junction device of claim 4, wherein the metallic layer causes an oxidation reaction by the heat treatment, and
is converted into the oxide layer by receiving oxygen emitted by the reduction reaction of the first metallic oxide layer and the second metallic oxide layer.

6. The method of manufacturing the magnetic tunnel junction device of claim 1, wherein the initial multilayer structure includes a first metallic oxide layer, a second metallic oxide layer, a first metallic layer, a immediate metallic layer, and a second metallic layer,
in the lamination step, the first metallic oxide layer, the first metallic layer, the immediate metallic layer, the second metallic layer, and the second metallic oxide layer are laminated in sequence to form the initial multilayer structure, and
the immediate metallic layer is a material having higher oxygen affinity than the materials of the first metallic layer and the second metallic layer and formed of at least one material of MgOx, AlOx, TiOx, ZrOx, HfOx, VOx, NbOx, TaOx and CrOx or a combined material thereof.

7. The method of manufacturing the magnetic tunnel junction device of claim 1, wherein in the heat treatment step, the heat treatment is performed by a thermal annealing method and
the annealing is treated under a temperature condition of 300° C. to 500° C. and a time duration of 1 hr to 5 hr.

8. A magnetic tunnel junction device comprising:
a first ferromagnetic material layer formed by heat-treating a first metallic oxide layer;
a second ferromagnetic material layer formed by heat-treating a second metallic oxide layer; and
an oxide layer located between the first ferromagnetic material layer and the second ferromagnetic material layer, formed by heat-treating a metallic layer, and transmitting electrons of the first ferromagnetic material layer and the second ferromagnetic material layer through a tunneling phenomenon.

9. The magnetic tunnel junction device of claim 8, wherein the first ferromagnetic material layer and the second ferromagnetic material layer are formed with a thickness of 1 nm to 3 nm, and
the oxide layer is formed with a thickness of 0.5 nm to 2 nm.

10. The magnetic tunnel junction device of claim 8, wherein the oxide layer is an insulator and transmits electrons only by the tunneling phenomenon not by a conducting phenomenon.

11. The magnetic tunnel junction device of claim 8, wherein the oxide layer is formed of at least one material of MgOx, AlOx, TiOx, ZrOx, HfOx, VOx, NbOx, TaOx and CrOx or a combined material thereof, and
the oxygen of the oxide layer is generated by a reduction reaction of the first metallic oxide layer and the second metallic oxide layer.

12. The magnetic tunnel junction device of claim 8, wherein the oxide layer includes a first oxide layer, an intermediate oxide layer, and a second oxide layer formed by heat-treating the metallic layer including a first metallic layer, a intermediate metallic layer, and a second metallic layer,
the first oxide layer and the second oxide layer are layers formed of the same material, and
the intermediate oxide layer is a layer formed of a different material from the materials of the first oxide layer and the second oxide layer.

13. The magnetic tunnel junction device of claim 12, wherein the intermediate metallic layer for forming the intermediate oxide layer is a material having higher oxygen affinity than the first metallic layer and the second metallic layer.

14. The magnetic tunnel junction device of claim 8, further comprising:
a first perpendicular magnetization inductive layer laminated on a lower end of the first ferromagnetic material layer;
a second perpendicular magnetization inductive layer laminated on an upper end of the second ferromagnetic material layer;
a seed layer laminated on a lower end of the first perpendicular magnetization inductive layer; and
a protective layer laminated on a lower end of the second perpendicular magnetization inductive layer.

15. The magnetic tunnel junction device of claim 14, wherein the first perpendicular magnetization inductive layer and the second perpendicular magnetization inductive layer are formed of at least one material of Pt and Pd materials or a combined material thereof for inducing the magnetization to vertically occur.

16. The magnetic tunnel junction device of claim 14, wherein the seed layer and the protective layer are formed of an oxide layer formed by suctioning oxygen diffused from the first metallic oxide layer and the second metallic oxide layer from the oxygen suction metallic layer during the heat treatment, and
formed of the oxide layer in which the oxygen is combined with at least one material of Ru, Ta, Mo, Ti and TiN or a combined material thereof, wherein the thickness of each of the seed layer and the protective layer is formed with a thickness at least 1.5 times larger than the thickness of each of the first perpendicular magnetization inductive layer and the second perpendicular magnetization inductive layer.

17. The magnetic tunnel junction device of claim 8, wherein the first ferromagnetic material layer and the second ferromagnetic material layer are formed by a reduction reaction occurring in the first metallic oxide layer and the second metallic oxide layer by the heat treatment, and
the oxide layer is formed by an oxidation reaction occurring in the metallic layer by the heat treatment, wherein the oxide layer is formed by receiving oxygen emitted from the first metallic oxide layer and the second metallic oxide layer.

18. The magnetic tunnel junction device of claim 8, wherein the first metallic oxide layer and the second metallic oxide layer are formed of at least one material of NiOx, FeOx, FeNiOx, CoNiOx, CoOx, CoFeBOx, and CoFeOx, or a combined material thereof, and the metallic layer is formed of at least one material of Mg, Al, Ti, Zr, Hf, V, Nb, Ta, and Cr or a combined material thereof.

19. The magnetic tunnel junction device of claim 8, wherein the average surface roughness of each of the interface between the first ferromagnetic material layer and the oxide layer and the interface between the second ferromagnetic material layer and the oxide layer is in the range of 0.1 nm to 0.8 nm.

20. A magnetic memory device comprising:
at least one bit line;
at least one word line; and
a first ferromagnetic material layer formed by connecting the at least one bit line and the at least one word line and heat-treating a first metallic oxide layer; a second ferromagnetic material layer formed by heat-treating a second metallic oxide layer; and an oxide layer located between the first ferromagnetic material layer and the second ferromagnetic material layer and formed by heat-treating a metallic layer.

* * * * *